(12) United States Patent
Lin et al.

(10) Patent No.: US 12,484,232 B2
(45) Date of Patent: Nov. 25, 2025

(54) FERROELECTRIC MEMORY DEVICE AND METHOD OF FABRICATING THE SAME

(71) Applicant: TAIWAN SEMICONDUCTOR MANUFACTURING COMPANY, LTD., Hsinchu (TW)

(72) Inventors: Tzu-Yu Lin, Taoyuan (TW); Yao-Wen Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 364 days.

(21) Appl. No.: 17/814,698

(22) Filed: Jul. 25, 2022

(65) Prior Publication Data
US 2023/0276633 A1    Aug. 31, 2023

Related U.S. Application Data

(60) Provisional application No. 63/314,015, filed on Feb. 25, 2022.

(51) Int. Cl.
*H01L 23/52* (2006.01)
*H01L 23/528* (2006.01)
(Continued)

(52) U.S. Cl.
CPC ......... *H10B 51/30* (2023.02); *H01L 23/5283* (2013.01); *H10D 30/0415* (2025.01); *H10D 30/701* (2025.01)

(58) Field of Classification Search
CPC ........ H10B 51/30; H10B 53/30; H10B 53/50; H01L 23/5283; H01L 29/6684;
(Continued)

(56) References Cited

U.S. PATENT DOCUMENTS 6,140,672 A * 10/2000 Arita ............... H10B 53/00
257/E21.59
10,879,269 B1 * 12/2020 Zhang .................. H10B 51/20
(Continued)

FOREIGN PATENT DOCUMENTS

DE      102020110759 A1    9/2021
KR      1020200037087 A    4/2020
(Continued)

OTHER PUBLICATIONS

Athle et al. "Effects of tin top electrode texturing on ferroelectricity in hf1-x zr x o2." ACS applied materials & interfaces 13.9 (2021): 11089-11095.
(Continued)

*Primary Examiner* — Sheikh Maruf
(74) *Attorney, Agent, or Firm* — Sterne, Kessler, Goldstein & Fox P.L.L.C.

(57) ABSTRACT

The present disclosure describes a semiconductor device having a ferroelectric memory with improved retention after cycling (RAC) memory window (MW) performance. The semiconductor device includes an interconnect structure on a substrate, a first electrode on the interconnect structure, a ferroelectric layer on the first electrode, and a second electrode on the ferroelectric layer. The first electrode includes a metal nitride conductive material having a nitrogen concentration greater than a metal concentration. The ferroelectric layer includes a ferroelectric material. The second electrode includes the metal nitride conductive material.

20 Claims, 22 Drawing Sheets

(51) Int. Cl.
*H10B 51/30* (2023.01)
*H10D 30/01* (2025.01)
*H10D 30/69* (2025.01)

(58) Field of Classification Search
CPC ... H01L 29/78391; H01L 28/55; H01L 28/65; H01L 28/75; H01L 28/60; H01L 2924/1441
USPC .......................................................... 257/295
See application file for complete search history.

(56) References Cited

U.S. PATENT DOCUMENTS

| | | | | |
|---|---|---|---|---|
| 11,152,048 | B1* | 10/2021 | Prasad | G11C 11/1657 |
| 11,839,088 | B1* | 12/2023 | Sato | H10D 1/694 |
| 11,955,512 | B1* | 4/2024 | Rathi | H01L 23/5223 |
| 12,108,608 | B1* | 10/2024 | Sato | H10D 1/682 |
| 2005/0006680 | A1* | 1/2005 | Song | H10D 1/682 |
| | | | | 257/295 |
| 2007/0215923 | A1* | 9/2007 | Tamura | H10D 1/694 |
| | | | | 257/295 |
| 2009/0134440 | A1* | 5/2009 | Kanaya | H10D 1/682 |
| | | | | 257/295 |
| 2014/0203341 | A1* | 7/2014 | Guo | H10N 50/10 |
| | | | | 257/295 |
| 2016/0372478 | A1* | 12/2016 | Ino | H10B 53/20 |
| 2020/0105772 | A1 | 4/2020 | Chen et al. | |
| 2020/0335353 | A1* | 10/2020 | Chen | H01L 23/528 |
| 2020/0411072 | A1* | 12/2020 | Zhang | H10B 51/20 |
| 2020/0411758 | A1 | 12/2020 | Lin et al. | |
| 2021/0074708 | A1* | 3/2021 | Huang | H10B 12/485 |
| 2021/0082956 | A1* | 3/2021 | Suzuki | H10B 43/23 |
| 2021/0091095 | A1* | 3/2021 | Ino | H10B 51/30 |
| 2021/0305356 | A1 | 9/2021 | Cheng et al. | |
| 2021/0335799 | A1* | 10/2021 | Lee | H10D 1/68 |
| 2021/0343731 | A1* | 11/2021 | Chen | H10D 1/692 |
| 2021/0358925 | A1* | 11/2021 | Takahashi | H10D 30/701 |
| 2021/0366932 | A1* | 11/2021 | Lee | H10B 51/00 |
| 2021/0375888 | A1* | 12/2021 | Lu | H10D 30/6755 |
| 2021/0376153 | A1* | 12/2021 | Lu | H10D 99/00 |
| 2023/0189532 | A1* | 6/2023 | Müller | G11C 11/221 |
| | | | | 257/295 |
| 2023/0284455 | A1* | 9/2023 | Thareja | G11C 11/221 |
| | | | | 257/295 |

FOREIGN PATENT DOCUMENTS

| | | |
|---|---|---|
| KR | 1020210002327 A | 1/2021 |
| TW | 202137397 A | 10/2021 |

OTHER PUBLICATIONS

Lieberman et al. "Design of high-density plasma sources for materials processing." Berkeley: EECS Department, University of California, 1993. IX.C Charging.—Technical Report No. UCB/ERL M93/3. 1-126.

Park et al. "Plasma-induced charging damage of a ferroelectric capacitor during interconnect metal etch." 2000 5th International Symposium on Plasma Process-Induced Damage (IEEE Cat. No. 00TH8479). IEEE, 2000.

* cited by examiner

FERROELECTRIC MEMORY DEVICE AND METHOD OF FABRICATING THE SAME

CROSS-REFERENCE TO RELATED APPLICATION

This patent application claims benefit of U.S. Provisional Patent Application No. 63/314,015, filed on Feb. 25, 2022 and titled "Ferroelectric Memory and Method of Fabricating the Same," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes and the requirement of electronic memory.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
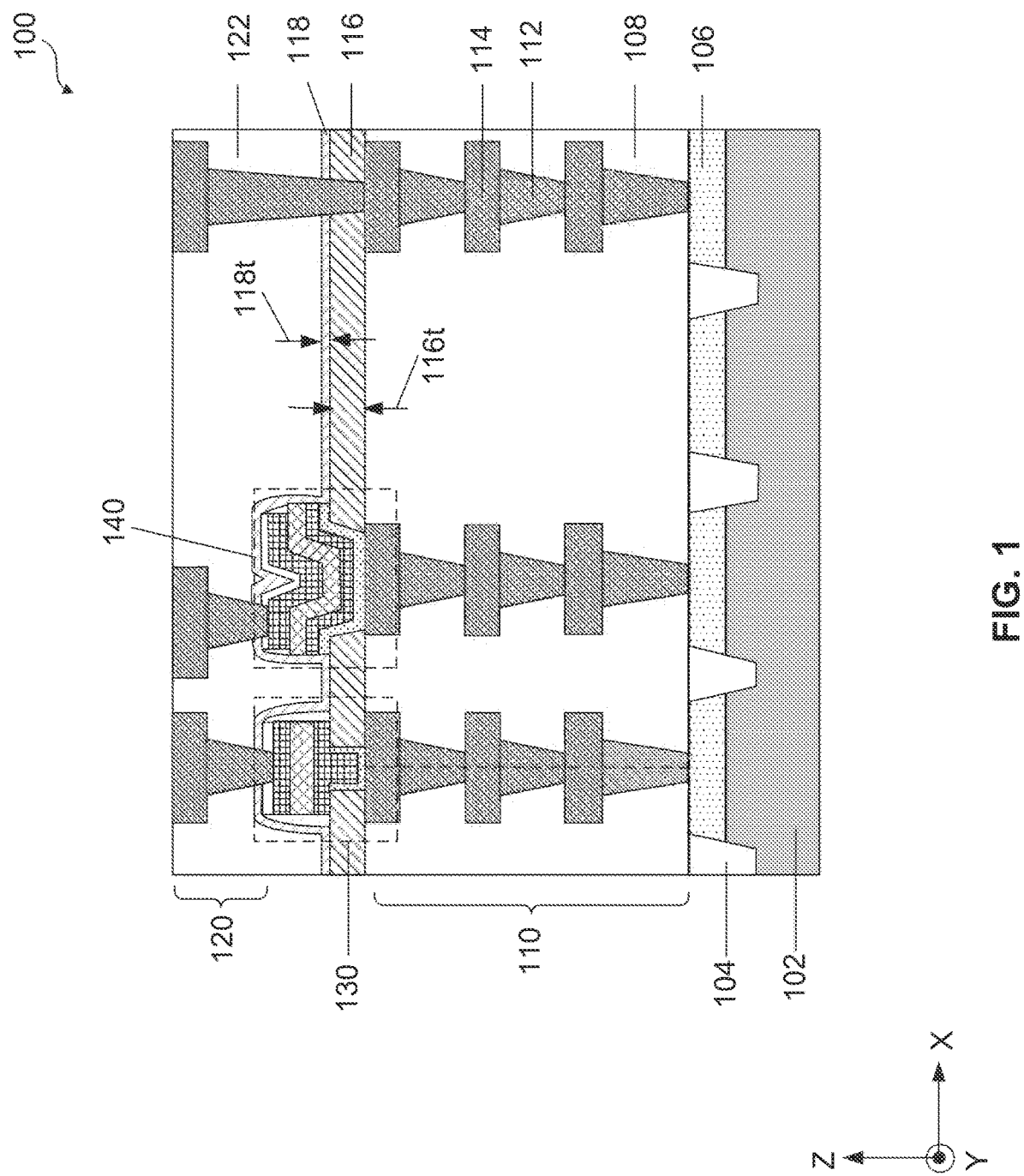
FIG. 1 illustrates a cross-sectional view of a semiconductor device having a ferroelectric memory with improved retention after cycling (RAC) memory window (MW) performance, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

Electronic memory in electronic devices is configured to store data. Electronic memory includes volatile memory and non-volatile memory. Volatile memory maintains data with a power supply, while non-volatile memory is able to maintain data without a power supply. Ferroelectric random-access memory (FeRAM) devices is a type of non-volatile memory. FeRAM provides various benefits over other non-volatile memories, for example, a faster write time, a higher endurance, a lower power consumption, and a lower susceptibility to damage from radiation.

A FeRAM device can include a transistor connected to a ferroelectric memory. The ferroelectric memory can include a top electrode, a bottom electrode, and a ferroelectric film, which is composed of a ferroelectric material between the top and bottom electrodes. Various aspects of device performance (e.g. switching voltage, memory window, retention, endurance, etc.) of the FeRAM device can depend on the ferroelectric material. A memory window (MW) is defined as a threshold voltage difference of the FeRAM device due to polarization switching. The FeRAM performance can be evaluated by a retention MW after a large number of read/write cycles (e.g., about 1000 to about 10000 cycles). With increasing demand for lower power consumption, higher performance, and smaller semiconductor devices, dimensions of semiconductor devices continue to scale down. The continuous scaling down of device dimensions and the demand for increasing device performance may lead to various challenges for FeRAM devices. For example, the retention after cycling (RAC) MW performance of the FeRAM device may degrade with the scaling down of the device dimension after a large number of read/write cycles about 1000).

Various embodiments of the present disclosure provide example semiconductor devices having a ferroelectric memory with enhanced RAC MW performance and example methods to fabricate the same. In some embodiments, the semiconductor device can include nitrogen-rich top and bottom electrodes and a ferroelectric layer between the top and bottom electrodes. In some embodiments, the nitrogen-rich bottom electrode can improve the formation of an orthorhombic phase (O-phase) ferroelectric material in the ferroelectric layer. In some embodiments, the nitrogen-rich top electrode can increase the tensile stress between the top electrode and the ferroelectric layer. An anneal process after the deposition of the nitrogen-rich top electrode can improve the formation of the O-phase ferroelectric material in the ferroelectric layer. In some embodiments, the nitrogen-rich top and bottom electrodes can include a metal nitride material with a nitrogen-to-metal ratio ranging from about 1.04 to about 1.20 to increase a (111) crystal orientation in the metal nitride material. In some embodiments, the ratio of the (111) crystal orientation to a (200) crystal orientation can range from about 1.6 to about 2.0 to enhance the formation, uniformity, and stabilization of the O-phase ferroelectric material in the ferroelectric layer. In some embodiments, with nitrogen-rich top and bottom electrodes, the ferroelectric memory can have improved RAC MW performance after about 10,000 read/write cycles, compared to degraded RAC MW performance after about 1000 read/write cycles for ferroelectric memories without nitrogen-rich top and bottom electrodes.

FIG. 1 illustrates a cross-sectional view of a semiconductor device 100 having ferroelectric memories with improved RAC MW performance, in accordance with some embodiments. As shown in FIG. 1, semiconductor device 100 can include a substrate 102, shallow trench isolation (STI) regions 104, a device layer 106, a first interlayer dielectric (ILD) structure 108, a first interconnect structure 110, an etch stop layer (ESL) 116, a dielectric layer 118, a second ILD structure 122, a second interconnect structure 120, a first ferroelectric memory 130, and a second ferroelectric memory 140.

Referring to FIG. 1, substrate 102 can include a semiconductor material such as crystalline silicon (Si). In some embodiments, substrate 102 can include (i) an elementary semiconductor, such as germanium (Ge); (ii) a compound semiconductor including silicon carbide (SiC), silicon arsenide (SiAs), gallium arsenide (GaAs), gallium phosphide (GaP), and/or a III-V semiconductor material; (iii) an alloy semiconductor including silicon germanium (SiGe), silicon germanium carbide (SiGeC), germanium tin (GeSn), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Alternatively, the substrate can be made from an electrically non-conductive material, such as glass and sapphire wafer. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants phosphorus or arsenic). For example purposes, substrate 102 will be described in the context of crystalline Si. Based on the disclosure herein, other materials, as discussed above, can be used. These materials are within the spirit and scope of this disclosure.

Device layer 106 can be disposed on substrate 102 and separated by STI regions 104. In some embodiments, device layer 106 can include one or more devices, such as MOSFETs, finFETs, gate-all-around (GAA) FETs, nanostructure transistors, and other active devices or passive devices. In some embodiments, the nanostructure transistors can include nanosheet transistors, nanowire transistors, multi-bridge channel transistors, nano-ribbon transistors, etc. The nanostructure transistors provide a channel in a stacked nanostructure configuration.

STI regions 104 can provide electrical isolation between the one or more devices in device layer 106 from each other and from neighboring active and passive elements (not shown) integrated with or deposited on substrate 102. STI regions 104 can be made of a dielectric material. In some embodiments, STI regions 104 can include silicon oxide ($SiO_x$), silicon nitride ($SiN_x$), silicon oxynitride (SiON), fluorine-doped silicate glass (FSG), a low-k dielectric material, and/or other suitable insulating materials. In some embodiments, STI regions 104 can include a multi-layered structure.

First interconnect structure 110 can be disposed in first ILD structure 108 and can be connected to the one or more devices in device layer 106. Second interconnect structure 120 can be disposed in second ILD structure 122 and can be connected to first interconnect structure 110 and first and second ferroelectric memories 130 and 140. In some embodiments, each of first and second interconnect structures 110 and 120 can include one or more metal lines 114 and metal vias 112. In some embodiments, metal lines 114 and metal vias 112 can include copper (Cu), aluminum (Al), titanium nitride (TiN), tantalum nitride (TaN), tungsten (W), and other suitable conductive materials.

First ILD structure 108 can be disposed around first interconnect structure 110 and second ILD structure 122 can be disposed around second interconnect structure 120. First and second ILD structures 108 and 122 can provide electrical isolation between adjacent metal lines 114 and metal vias 112 of first and second interconnect structures 110 and 120. In some embodiments, first and second ILD structures 108 and 122 can include a dielectric material, such as $SiO_x$, silicon hydroxide (SiOH), SiON, $SiN_x$, silicon oxycarbide (SiOC), silicon oxynitricarbide (SiOCN), and a combination thereof. In some embodiments, first and second ILD structures 108 and 122 can include a dielectric material deposited using a deposition method suitable for flowable dielectric materials. For example, flowable silicon oxide can be deposited using flowable chemical vapor deposition (FCVD). In some embodiments, first and second ILD structures 108 and 122 can include the same dielectric material. In some embodiments, first and second ILD structures 108 and 122 can include dielectric materials different from each other. In some embodiments, first and second structures 108 and 122 can include a stack of dielectric layers.

Referring to FIG. 1, ESL 116 can be disposed on first interconnect structure 110 and first ILD structure 108. ESL 116 can be configured to protect first ILD structure 108 and first interconnect structure 110 during the formation of first and second ferroelectric memories 130 and 140 and second interconnect structure 120 on first interconnect structure 110. In some embodiments, ESL 116 can include, for example, $SiN_x$, silicon carbide (SiC), silicon carbo-nitride (SiCN), or other suitable dielectric materials. In some embodiments, ESL 116 can have a thickness 116t ranging from about 30 nm to about 50 nm.

Dielectric layer 118 can be disposed on first and second ferroelectric memories 130 and 140 and ESL 116. Dielectric layer 118 can be configured to protect first and second ferroelectric memories 130 and 140 during the formation of second ILD structure 122 and second interconnect structure 120 in subsequent processes. In some embodiments, dielectric layer 118 can include a dielectric material, such as $SiO_x$, $SiN_x$, SiON, SiOC, SiCN, SiOCN, and a combination thereof. In some embodiments, dielectric layer 118 can have a thickness 118t ranging from about 1 nm to about 10 nm.

Figure 2A:
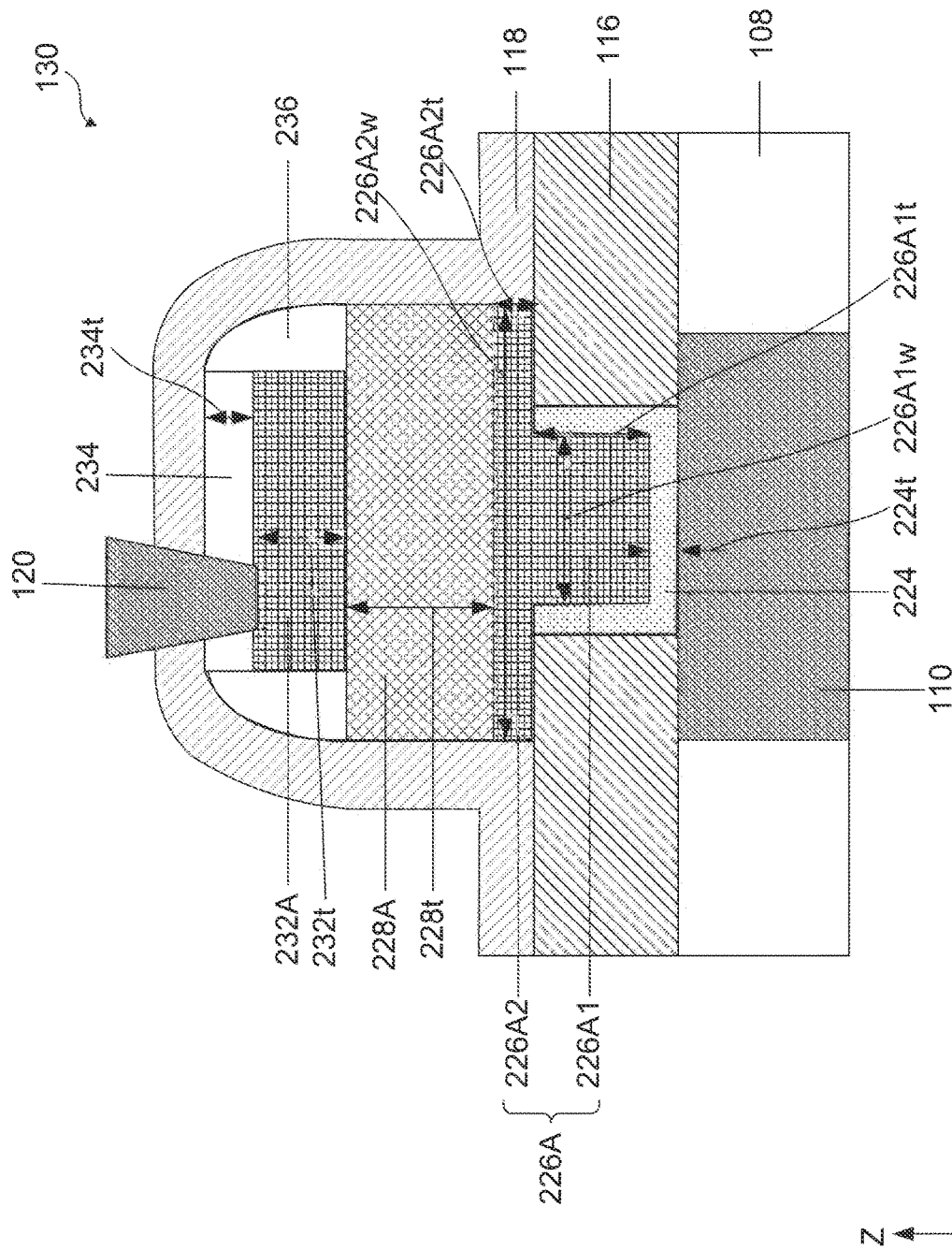
FIGS. 2A and 2B illustrate enlarged cross-sectional views of a semiconductor device having a ferroelectric memory with improved RAC MW performance, in accordance with some embodiments.
Figure 2B:
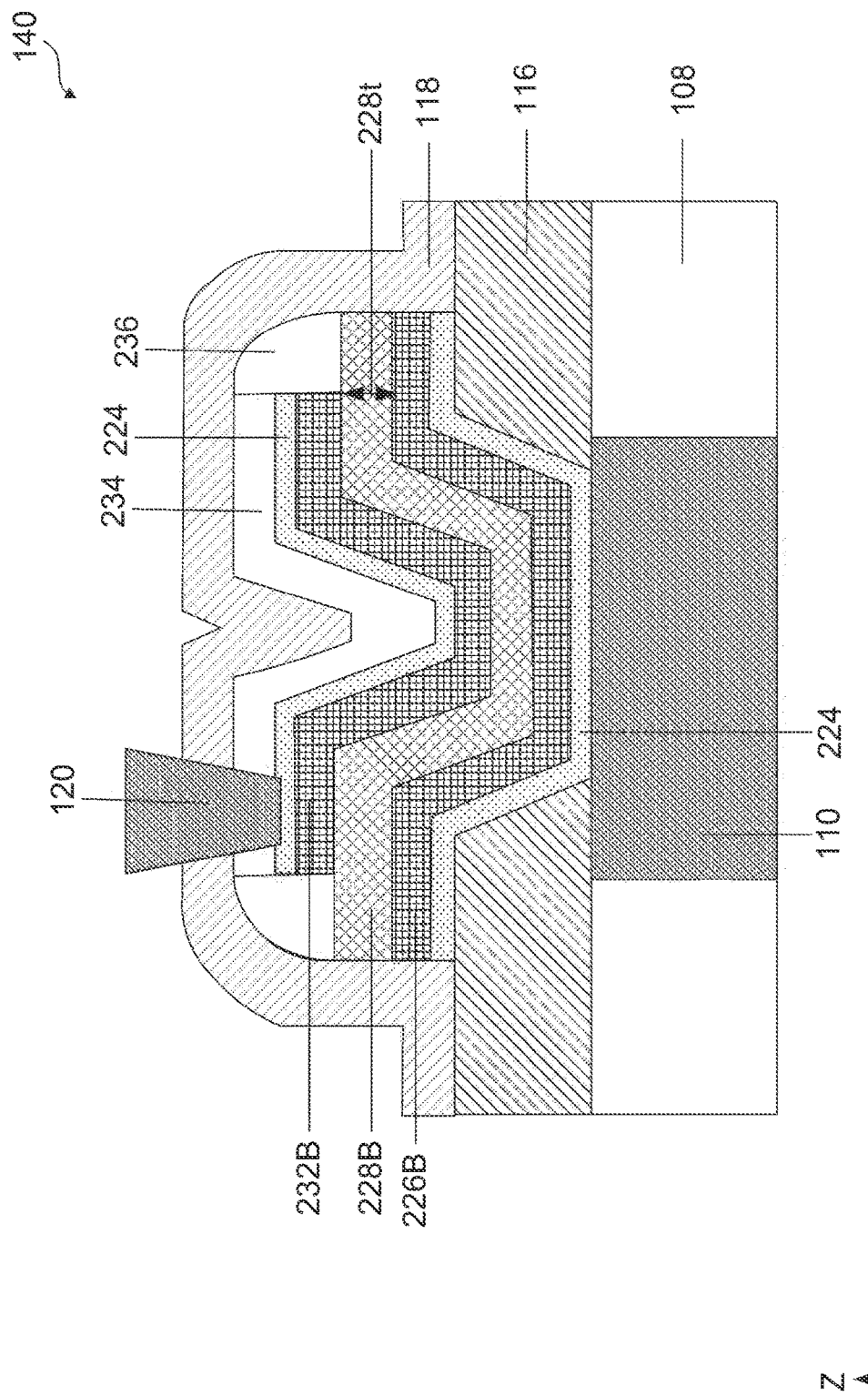

Referring to FIG. 1, first and second ferroelectric memories 130 and 140 can be disposed on first interconnect structure 110 and electrically connected to first and second interconnect structures 110 and 120. In some embodiments, first and second ferroelectric memories 130 and 140 may be formed at different areas on substrate 102 or on different substrates. First and second ferroelectric memories 130 and 140 are illustrated adjacent to each other in FIG. 1 merely for example purposes. FIGS. 2A and 2B illustrate enlarged cross-sectional views of first and second ferroelectric memories 130 and 140, respectively, in accordance with some embodiments. In some embodiments, first ferroelectric memory 130 can be formed with a chemical-mechanical polishing (CMP) process, and second ferroelectric memory 140 can be formed without the CMP process. As shown in FIGS. 1, 2A and 2B, semiconductor device 100 can further include a barrier layer 224, first electrodes 226A and 226B (collectively referred to as "first electrode 226"), ferroelectric layers 228A and 228B (collectively referred to as "ferroelectric layer 228"), second electrodes 232A and 232B (collectively referred to as "second electrode 232"), a cap layer 234, and spacers 236.

In some embodiments, barrier layer 224 can be disposed on metal lines 114 to prevent metal diffusion from first interconnect structure 110 to first electrode 226. In some embodiments, barrier layer 224 can be disposed on second electrode 232 to prevent metal diffusion from metal vias 112 of second interconnect structure 120 to second electrode 232. In some embodiments, barrier layer 224 on second electrode 232 can be optional. In some embodiments, barrier layer 224 can include a conductive material, for example, tantalum (Ta), tantalum nitride (TaN), titanium (Ti), titanium nitride (TiN), or other suitable conductive materials. In some embodiments, barrier layer 224 can have a thickness 224t ranging from about 5 nm to about 15 nm.

Referring to FIGS. 2A and 2B, first electrode 226 can be disposed on barrier layer 224. In some embodiments, as shown in FIG. 2A, first electrode 226A can include first portion 226A1 and second portion 226A2. First portion 226A1 can be disposed within ESL 116 and second portion 226A2 can be disposed on first portion 226A1 and ESL 116. In some embodiments, first portion 226A1 can have a width 226A1w along an X-axis ranging from about 50 nm to about 100 nm. In some embodiments, second portion 226A2 can have a width 226A2w along an X-axis ranging from about 100 nm to about 1000 nm. In some embodiments, width 226A2w can be greater than width 226A1w to increase the plate area of first electrode 226A and improve performance of first ferroelectric memory 130. In some embodiments, first portion 226A1 can have a thickness 226A1t along a Z-axis ranging from about 20 nm to about 50 nm. In some embodiments, second portion 226A2 can have a thickness 226A2t along a Z-axis ranging from about 1 nm to about 5 nm. If thickness 226A2t is less than about 1 nm, second portion 226A2 may not be uniformly formed on first portion 226A1 and ESL 116. If thickness 226A2t is greater than about 5 nm, manufacturing cost to form nitrogen-rich second portion 226A2 may increase.

In some embodiments, first and second portions 226A1 and 226A2 of first electrode 226A can include a metal nitride material, for example, TiN, zirconium nitride (ZrN), hafnium nitride (HfN), vanadium nitride (VN), chromium nitride (CrN), niobium nitride (NbN), scandium nitride (ScN), or other suitable metal nitride materials. In some embodiments, first and second portions 226A1 and 226A2 can both include a nitrogen-rich metal nitride having a nitrogen-to-metal ratio greater than about 1. In some embodiments, the nitrogen-to-metal ratio of the nitrogen-rich metal nitride can range from about 1.04 to about 1.20 to improve the formation and stabilization of the O-phase ferroelectric material in ferroelectric layer 228. The O-phase ferroelectric material can improve RAC MW performance of first ferroelectric memory 130. If the nitrogen-to-metal ratio is less than about 1.04, the metal nitride material in first electrode 226A may not improve the formation and stabilization of O-phase ferroelectric material in ferroelectric layer 228. If the nitrogen-to-metal ratio is greater than about 1.20, the nitrogen-rich metal nitride material in first electrode 226A may not be formed and stabilized. In some embodiments, first electrode 226A can include nitrogen-rich TiN.

In some embodiments, the metal nitride material in first electrode 226A can have a mixture of (111) crystal orientation and (200) crystal orientation. Higher intensity of (111) crystal orientation can improve the formation and stabilization of O-phase ferroelectric material in ferroelectric layer 228. In some embodiments, a ratio of the (111) crystal orientation intensity to the (200) crystal orientation intensity in the nitrogen-rich metal nitride material of first electrode 226A can range from about 1.6 to about 2.0. If the ratio is less than about 1.6, the metal nitride material in first electrode 226A may not improve the formation and stabilization of O-phase ferroelectric material in ferroelectric layer 228. If the ratio is greater than about 2.0, the nitrogen-rich metal nitride material in first electrode 226A may not be formed and stabilized.

In some embodiments, first portion 226A1 can include a metal nitride material and second portion 226A2 can include the nitrogen-rich metal nitride material. The metal nitride material in first portion 226A1 can have a nitrogen-to-metal ratio less than about 1.0. In some embodiments, the nitrogen-to-metal ratio of the metal nitride material in first portion 226A1 can range from about 0.5 to about 1.0. In some embodiments, the ratio of the (111) crystal orientation intensity to the (200) crystal orientation intensity in the metal nitride material of first portion 226A1 can range from about 0.5 to about 1.35. In some embodiments, the metal nitride material of first portion 226A1, which has a nitrogen-to-metal ratio lower than that of the nitrogen-rich metal nitride material, can have a lower resistance than the nitrogen-rich metal nitride material. In some embodiments, the metal nitride material of first portion 226A1 can be formed by physical vapor deposition (PVD) with a higher deposition rate than the nitrogen-rich metal nitride material to improve throughput. Therefore, compared to first electrode 226A with first and second portions 226A1 and 226A2 both having the nitrogen-rich metal nitride material, first electrode 226A with first portion 226A1 having a metal nitride material and second portions 226A2 having the nitrogen-rich metal nitride material can have a higher output, a lower resistance, and an improved device performance.

In some embodiments, as shown in FIG. 2B, first electrode 226B can be conformally formed on barrier layer 224 without a CMP process. In some embodiments, first electrode 226B can include a nitrogen-rich metal nitride material the same as or different from first electrode 226A. In some embodiments, first electrode 226B can include a nitrogen-rich TiN. In some embodiments, first electrode 226B can have a thickness 226Bt ranging from 10 nm to about 50 nm. If thickness 226Bt is less than about 10 nm, first electrode 226B may not be uniformly formed on barrier layer 224. If thickness 226Bt is greater than about 50 nm, manufacturing cost to form nitrogen-rich first electrode 226B may increase. Compared to first ferroelectric memory 130, second ferroelectric memory 140 can be formed without the CMP process and thus can have a simpler manufacturing process, while first electrode 226B of second ferroelectric memory 140 may have a higher resistance due to the nitrogen-rich metal nitride material.

Referring to FIGS. 2A and 2B, ferroelectric layer 228 can be disposed between first and second electrodes 226 and 232. In some embodiments, ferroelectric layer 228 can include a high-k dielectric material. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9). In some embodiments, ferroelectric layer 228 can include hafnium zirconium oxide (HfZrO), hafnium aluminum oxide (HfAlO), hafnium lanthanum oxide (HfLaO), hafnium cerium oxide (HfCeO), hafnium oxide (HfO), hafnium silicon oxide (HfSiO), hafnium gadolinium oxide (HfGdO), or other suitable high-k dielectric materials. In some embodiments, ferroelectric layer 228 can include HrZrO with a hafnium concentration ranging from about 40% to about 60%. In some embodiments, ferroelectric layer 228 can include HrAlO with a hafnium concentration ranging from about 40% to about 60% and an aluminum concentration ranging from about 5% to about 10%. In some embodiments, the high-k dielectric material in ferroelectric layer 228 can have a mixture of O-phase and other crystalline phases (e.g., α-phase). In some embodiments, with the nitrogen-rich metal nitride material in first electrode 226, the O-phase in the high-k dielectric material of ferroelectric layer 228 can have a higher concentration and an improved uniformity. With higher concentration and improved uniformity of the O-phase in the high-k dielectric material, the RAC MW performance of first and second ferroelectric memories 130 and 140 can be improved. In some embodiments, with improved O-phase concentration and uniformity in the high-k dielectric material, first and second ferroelectric memory 130 and 140 can have improved RAC MW performance after about 10,000 read/write cycles. In some embodiments, ferroelectric layer 228 can have a thickness 228t ranging from about 5 nm to about 30 nm.

Referring to FIGS. 2A and 2B, second electrode 232 can be disposed on ferroelectric layer 228. In some embodiments, second electrode 232 can include a nitrogen-rich metal nitride material, similar to first electrode 226. In some embodiments, second electrode 232 can include nitrogen-rich TiN. In some embodiments, the nitrogen-to-metal ratio of the nitrogen-rich metal nitride material in second electrode 232 can range from about 1.04 to about 1.20. In some embodiments, a ratio of the (111) crystal orientation intensity to the (200) crystal orientation intensity in the nitrogen-rich metal nitride material of second electrode 232 can range from about 1.6 to about 2.0. In some embodiments, the nitrogen-rich metal nitride material can increase the tensile stress between second electrode 232 and ferroelectric layer 228, which can improve the formation of the O-phase ferroelectric material in ferroelectric layer 228 during an anneal process. In some embodiments, second electrode 232 can have a thickness 232t ranging from about 10 nm to about 50 mn. In some embodiments, as shown in FIG. 2B, an optional barrier layer 224 can be disposed on second electrode 232B to prevent metal diffusion from second interconnect structure 120 to second electrode 232B. In some embodiments, an optional barrier layer 224 can also be disposed on first electrode 232A, though not shown in FIG. 2A.

Cap layer 234 can be disposed on second electrode 232 to protect second electrode 232 during subsequent processes. In some embodiments, cap layer 234 can include a dielectric material, for example, $SiO_x$, $SiN_x$, SiON, and other suitable dielectric materials. In some embodiments, cap layer 234 can include SiON. In some embodiments, cap layer 234 can have a thickness 234t ranging from about 10 nm to about 25 nm.

Spacers 236 can be disposed on sidewalk of second electrode 232 and cap layer 234. In some embodiments, spacers 236 can include a dielectric material, for example, $SiN_x$, aluminum nitride (AlN), SiON, and other suitable nitrogen-based dielectric materials. In some embodiments, spacers 236 can include a dielectric material the same as cap layer 234. In some embodiments, spacers 236 can include SiON. In some embodiments, spacers 236 can prevent short-circuit between first and second electrodes 226 and 232 due to re-deposition of metal nitride materials during subsequent etching processes.

Figure 2D:
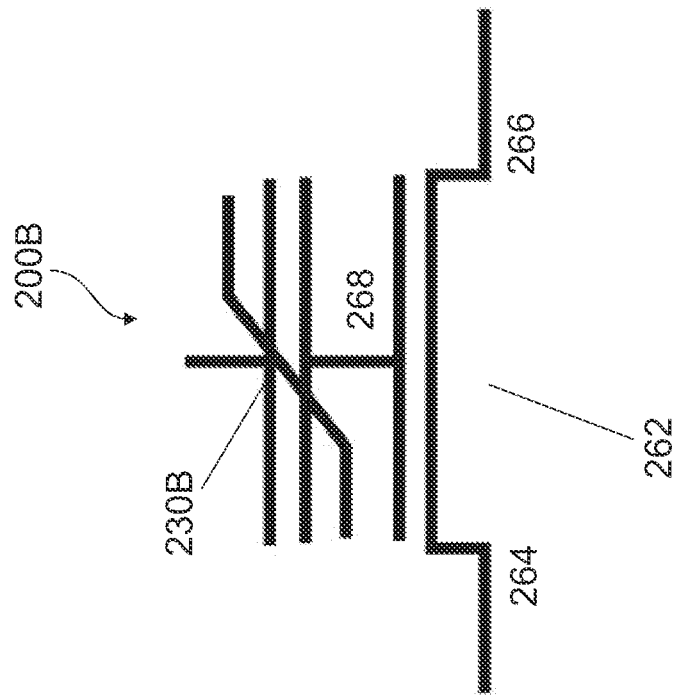
FIGS. 2C and 2D illustrate schematic diagrams of semiconductor devices having a ferroelectric memory with improved RAC MW performance, in accordance with some embodiments.
Figure 2C:
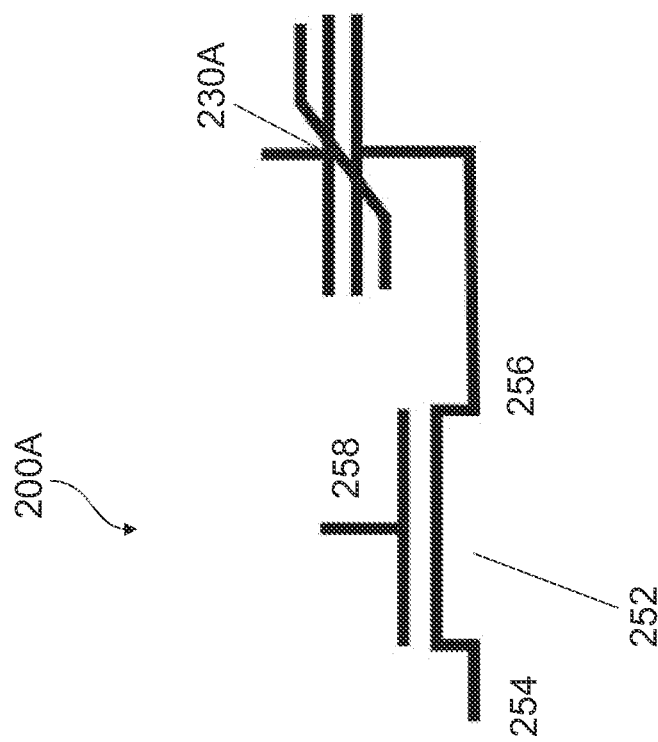

FIGS. 2C and 2D illustrate schematic diagrams of semiconductor devices 200A and 200B having ferroelectric memories with improved RAC MW performance, in accordance with some embodiments. As shown in FIGS. 2C and 2D, semiconductor devices 200A and 200B can include a one transistor-one capacitor (1 T-1 C) type ferroelectric memory device. In some embodiments, semiconductor device 200A can include a transistor 252 connected to a ferroelectric memory 230A, and semiconductor device 200B can include a transistor 262 connected to a ferroelectric memory 230B. Transistors 252 and 262 can include MOSFETs, finFETs, GAA FETs, nanostructure transistors, and other types of transistors. Transistor 252 can include a gate terminal 258 and source/drain (S/D) terminals 254 and 256. Transistor 262 can include a gate terminal 268 and source/drain (S/D) terminals 264 and 266. Ferroelectric memories 230A and 230B can be implemented with first ferroelectric memory 130 or second ferroelectric memory 140 having nitrogen-rich metal nitride materials described in FIGS. 1, 2A, and 2B. In some embodiments, as shown in FIG. 2C, ferroelectric memory 230A can be electrically connected to S/D terminal 256 and semiconductor device 200A can act as a ferroelectric random access memory device (FeRAM). In some embodiments, as shown in FIG. 2D, ferroelectric memory 230B can be electrically connected to gate terminal 268 and semiconductor device 200B can act as a ferroelectric field effect transistor (FeFET).

Figure 3:
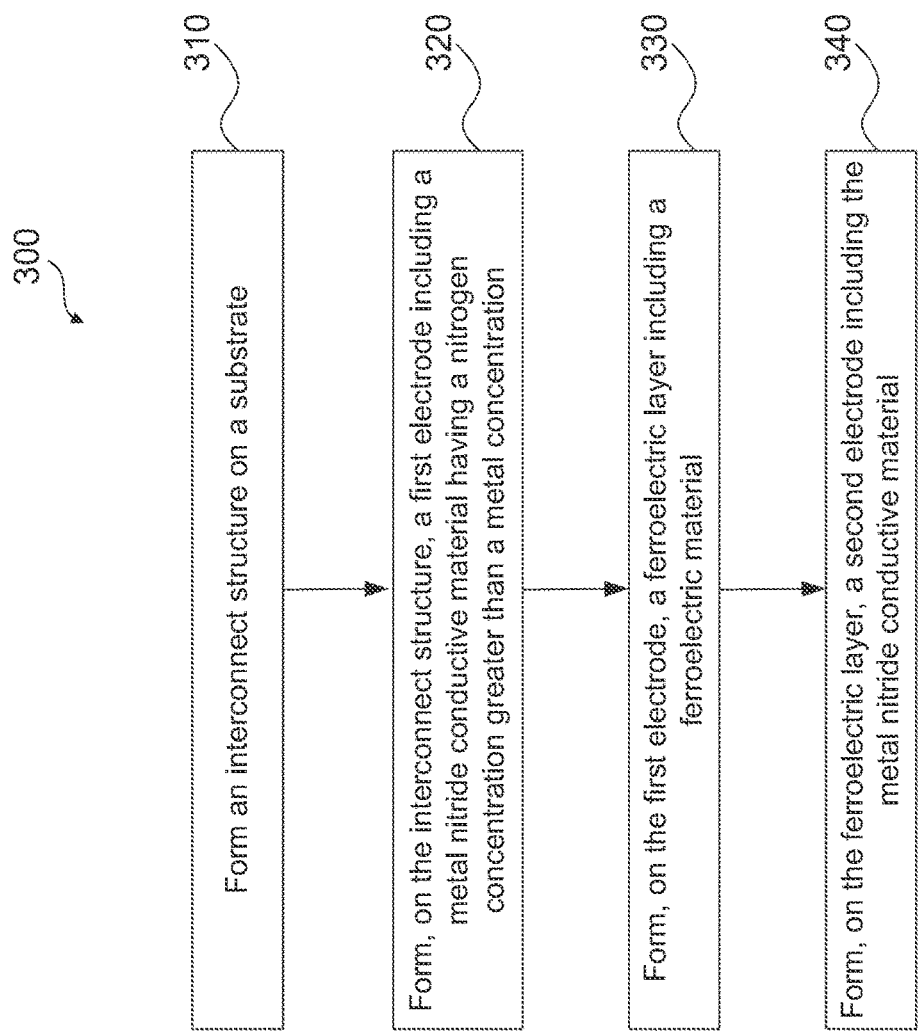
FIG. 3 is a flow diagram of a method for fabricating a semiconductor device having a ferroelectric memory with improved RAC MW performance, in accordance with some embodiments.

FIG. 3 is a flow diagram of method 300 for fabricating a semiconductor device having a ferroelectric memory with improved RAC MW performance, according to some embodiments. Method 300 may not be limited to semiconductor device 100 and can be applicable to other devices that would benefit from a ferroelectric memory with improved RAC MW performance. Additional fabrication operations may be performed between various operations of method 300 and may be omitted merely for clarity and ease of description. Additional processes can be provided before, during, and/or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations.

For illustrative purposes, the operations illustrated in FIG. 3 will be described with reference to the example fabrication process for fabricating semiconductor device 100 as illustrated in FIGS. 4-14 FIGS. 4-14 illustrate various partial cross-sectional views of semiconductor device 100 having a ferroelectric memory with improved RAC MW performance at various stages of its fabrication process, in accordance with some embodiments. In some embodiments, FIGS. 4-9 illustrates various stages of the fabrication process of first ferroelectric memory 130 shown in FIG. 1 with a CMP process. In some embodiments, FIGS. 10-14 illustrates various stages of the fabrication process of second ferroelectric memory 140 shown in FIG. 1 without a CMP process. Elements in FIGS. 4-14 with the same annotations as elements in FIGS. 1, 2A, and 2B are described above.

Figure 4:
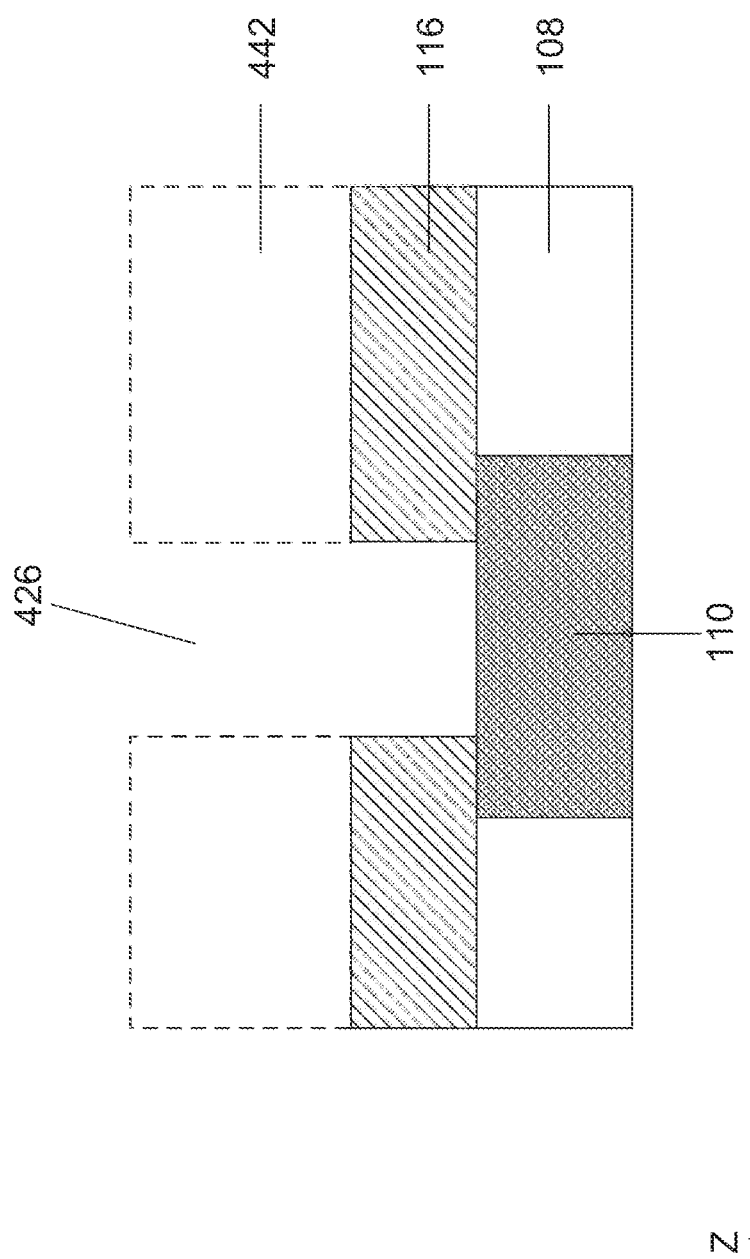
FIGS. 4-14 illustrate various partial cross-sectional views of a semiconductor device having a ferroelectric memory with improved RAC MW performance at various stages of its fabrication process, in accordance with some embodiments.

Referring to FIG. 3, method 300 begins with operation 310 and the process of forming an interconnect structure on a substrate. For example, as shown in FIGS. 1 and 4, first interconnect structure 110 can be formed on substrate 102. First interconnect structure 110 can include metal lines 114 and metal vias 112 and surrounded by first ILD structure 108. In some embodiments, metal lines 114, metal vias 112, and first ILD structure 108 can be formed layer by layer on substrate 102. First interconnect structure 110 can be electrically connected to one or more transistors in device layer 106, as illustrated in FIGS. 2C and 2D.

The formation of interconnect structure 110 can be followed by the formation of ESL 116. As shown in FIG. 4, ESL 116 can be conformally deposited on interconnect structure 110 and first ILD structure 108 by chemical vapor deposition (CVD), atomic layer deposition (ALD), or other suitable deposition methods. In some embodiments, ESL 116 can include a dielectric material, such as $SiN_x$, SiC, silica carbo-nitride SiCN, or other suitable dielectric materials.

Figure 5:
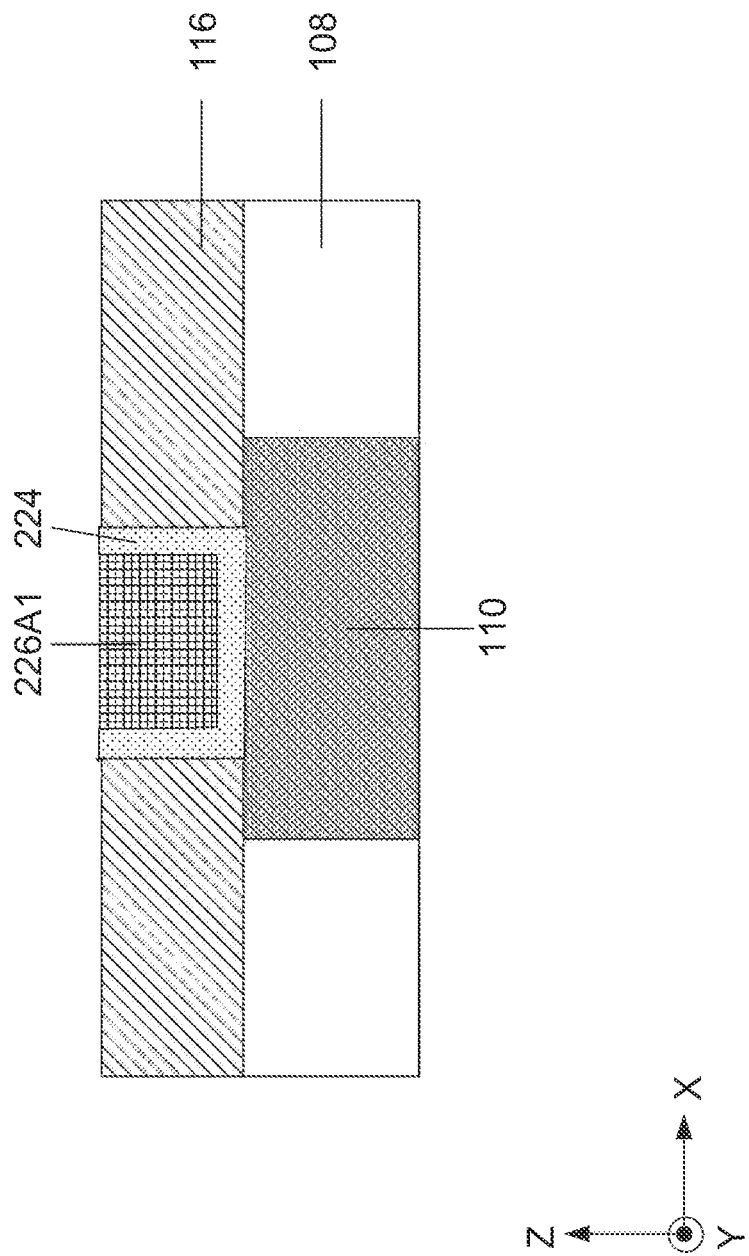
Figure 6:
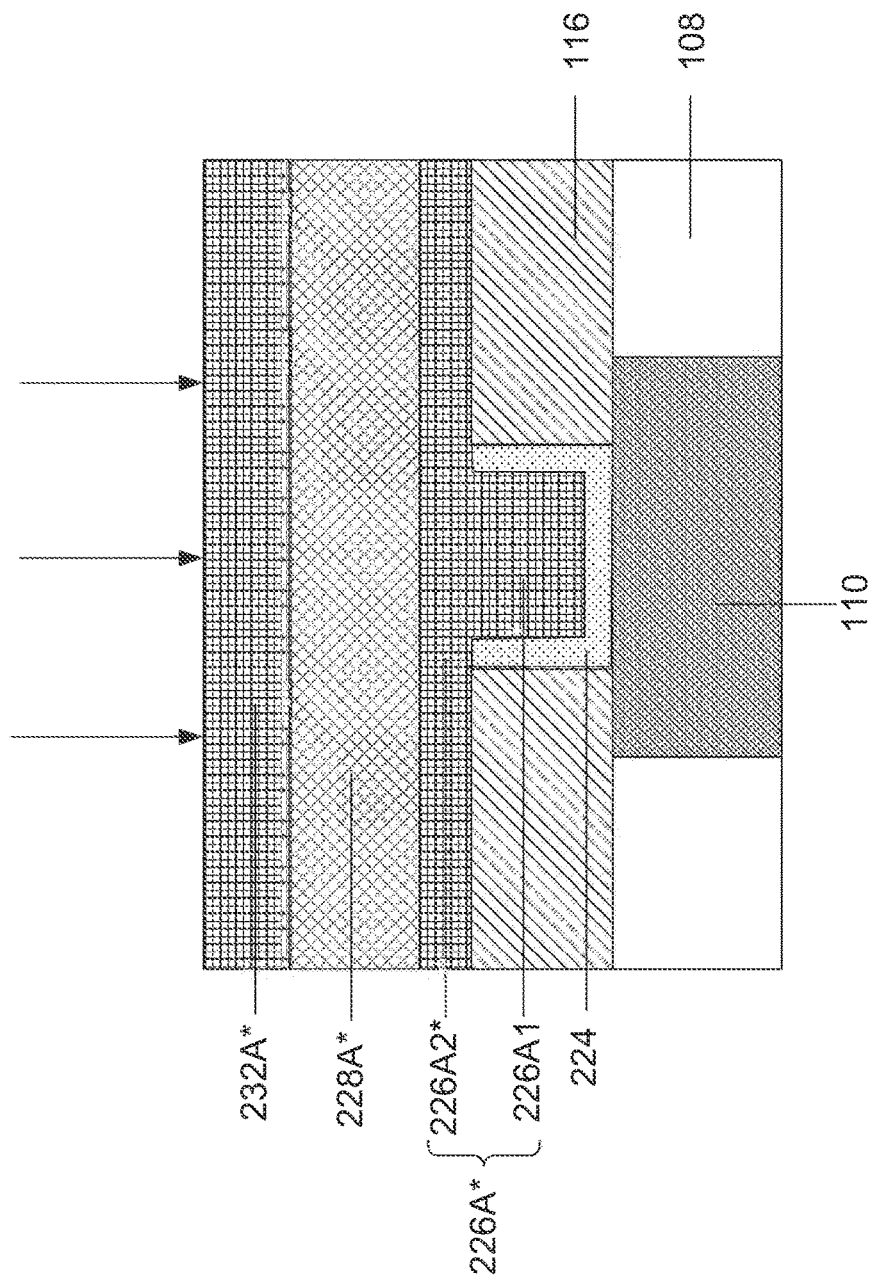

Referring to FIG. 3, method 300 continues with operation 320 and the process of forming, on the interconnect structure, a first electrode including a metal nitride conductive material having a nitrogen concentration greater than a metal concentration. For example, as shown in FIGS. 4-6, first electrode 226A* can be formed on interconnect structure 110. First electrode 226A* can include a nitrogen-rich metal nitride material that has a nitrogen concentration greater than a metal concentration. In some embodiments, the formation of first electrode 226A* can include forming an opening 426 in ESL 116 above interconnect structure 110, forming a barrier layer 224 on interconnect structure 110, forming first portion 226A1 of first electrode 226A* on barrier layer 224 with a CMP process, and forming second portion 226A2* on first portion 226A1 and ESL 116.

The formation of ESL 116 can be followed by the formation of opening 426, as shown in FIG. 4. By way of example and not limitation, photolithography and etch operations can be processed on ESL 116 to form an opening 426. A masking layer can be formed on ESL 116 and patterned to protect regions of ESL 116 during the etching process. Composition of the masking layer can include a photoresist, a hard mask, and/or other suitable materials. The patterning process can include forming the masking layer over ESL 116, exposing the photoresist to a pattern, performing post-exposure bake processes, and developing the resist to form a masking element 442 including the photoresist. Masking element 442 can be used to protect regions of ESL 116 while one or more etching processes sequentially removes exposed ESL 116. First interconnect structure 110 can act as the etch stop layer for etching ESL 116. Masking element 442 can be removed after etching ESL 116.

The formation of opening 426 can be followed by the formation of barrier layer 224, as shown in FIG. 5. In some embodiments, barrier layer 224 can be conformally deposited in opening 426 and on first interconnect structure 110 and ESL 116. In some embodiments, barrier layer 224 can be conformity deposited by CVD, ALD, PVD, or other suitable deposition methods. In some embodiments, barrier layer 224 can include a conductive material, for example, Ta, TaN, Ti, TiN, or other suitable conductive materials.

The deposition of barrier layer 224 can be followed by the formation of first portion 226A1 of first electrode 226A with a CMP process, as shown in FIG. 5. In some embodiments, a metal nitride material can be deposited on barrier layer 224 and ESL 116 to fill opening 426. The metal nitride material can include TiN, ZrN, HfN, VN, CrN, NbN, ScN, or other suitable metal nitride materials. In some embodiments, the metal nitride material in first portion 226A1 can include a metal nitride having a nitrogen-to-metal ratio less than about 1.0. The metal nitride in first portion 226A1 can be deposited by PVD, CVD, or other suitable method to increase deposition rate and improve throughput. In some embodiments, the metal nitride in first portion 226A1 can be deposited by a PVD process with a process power greater than about 3 kW (e.g., about 10 kW, about 20 kW) under a pressure from about 30 mtorr to about 75 mtorr. The metal nitride in first portion 226A1 can be deposited with a metal precursor and a nitrogen gas. In some embodiments, the metal precursor can be carried by an argon gas having a flow rate ranging from about 30 standard cubic centimeter (sccm) to about 500 sccm. In some embodiments, the nitrogen gas can have a flow rate ranging from about 150 sccm to about 1000 sccm.

In some embodiments, the metal nitride material in first portion 226A1 can include a nitrogen-rich metal nitride material having a nitrogen-to-metal ratio greater than about 1.0. In some embodiments, the nitrogen-to-metal ratio of the nitrogen-rich metal nitride material can range from about 1.04 to about 1.20 to increase the (111) crystal orientation in the metal nitride material, and thus improve the formation and stabilization of O-phase ferroelectric material in ferroelectric layer 228. In some embodiments, the nitrogen-rich metal nitride material can be deposited by a PVD process with a process power ranging from about 1 kW to about 3 kW under a pressure from about 30 mtorr to about 75 mtorr. With a lower process power, compared to the metal nitride deposition of first portion 226A1, the PVD process for nitrogen-rich metal nitride material can have a lower deposition rate and the deposited metal nitride material can have a higher nitrogen concentration and a higher concentration of the (111) crystal orientation. If the process power is less than about 1 kW, the nitrogen-rich metal nitride material may not be deposited on barrier layer 224 and ESL 116. If the process power is greater than about 3 kW, the nitrogen concentration and the (111) crystal orientation in the metal nitride material may decrease and the O-phase ferroelectric material in subsequently-formed ferroelectric layer 228 may decrease. The nitrogen-rich metal nitride material can be deposited with a metal precursor and nitrogen gas. In some embodiments, the metal precursor can be carried by an argon gas having a flow rate ranging from about 30 sccm to about 500 sccm. In some embodiments, the nitrogen gas can have a flow rate ranging from about 150 sccm to about 1000 sccm. After the deposition of metal nitride material, a CMP process can be performed to remove portions of the nitrogen-rich metal nitride material and barrier layer 224 on ESL 116 and planarize top surfaces of first portion 226A1, barrier layer 224, and ESL 116. In some embodiments, ESL 116 can act as the etching stop layer for the CMP process.

The formation of first portion 226A1 can be followed by the formation of second portion 226A2*, as shown in FIG. 6. In some embodiments, second portion 226A2* can be conformally deposited on first portion 226A1 and ESL 116. In some embodiments, second portion 226A2* can include the same metal nitride material as first portion 226A1. In some embodiments, first portion 226A1 and second portion 226A2* can include TiN. In some embodiments, second portion 226A2* can include a nitrogen-rich metal nitride material having a nitrogen-to-metal ratio greater than about 1.0. In some embodiments, the nitrogen-to-metal ratio of the nitrogen-rich metal nitride material can range from about 1.04 to about 1.20 to increase the (111) crystal orientation in the metal nitride material and to improve the formation and stabilization of O-phase ferroelectric material in ferroelectric layer 228. The O-phase ferroelectric material in ferroelectric layer 228 can improve RAC MW performance of ferroelectric memories.

Referring to FIG. 3, in operation 330, a ferroelectric layer having a ferroelectric material is formed on the first electrode. For example, as shown in FIG. 6, ferroelectric layer 228A* can be conformally deposited on first electrode 226A* by ALD, CVD, PVD, or other suitable deposition methods, Ferroelectric layer 228A* can include a high-k ferroelectric material, such as HfZrO, HfAlO, HfLaO, HfCeO, HfO, NfSiO, HfGdO, and a combination thereof. In some embodiments, the high-k ferroelectric material in ferroelectric layer 228A* can have a mixture of O-phase and other crystalline phases (e.g., α-phase). In some embodiments, the nitrogen-rich metal nitride material in first electrode 226A* can improve the concentration and uniformity of the O-phase in the high-k ferroelectric material of ferroelectric layer 228A*. With improved concentration and uniformity of the O-phase in the high-k ferroelectric material, the RAC MW performance of ferroelectric memory 130 can be improved. In some embodiments, with improved concentration and uniformity of O-phase high-k ferroelectric material, ferroelectric memory 130 can have improved RAC MW performance after about 10,000 read/write cycles, compared to degraded RAC MW performance after about 1000 read/write cycles for ferroelectric memories with low concentration of and non-uniform O-phase high-k ferroelectric material.

Referring to FIG. 3, in operation 340, a second electrode including the metal nitride material is formed on the ferroelectric layer. For example, as shown in FIGS. 6-9, second electrode 232A can be formed on ferroelectric layer 228A*. Second electrode 232A can include the nitrogen-rich metal nitride material. In some embodiments, the formation of second electrode 232A can include deposition of the nitrogen-rich metal nitride material, anneal of second electrode 232A*, deposition of cap layer 234*, etching second electrode 232A* and cap layer 234*, and etching ferroelectric layer 228A* and first electrode 226A.

The formation of ferroelectric layer 228A* can be followed by the conformal deposition of the nitrogen-rich metal nitride material, as shown in FIG. 6. In some embodiments, the nitrogen-rich metal nitride material can be conformally deposited on ferroelectric layer 228A* to form second electrode 232A*. In some embodiments, second electrode 232A* can include the same metal nitride material as first electrode 226A*, such as TiN. In some embodiments, second electrode 232A* can include a nitrogen-rich metal nitride material having a nitrogen-to-metal ratio greater than about 1.0. In some embodiments, the nitrogen-to-metal ratio of the nitrogen-rich metal nitride material can range from about 1.04 to about 1.20 to increase the tensile stress between second electrode 232A* and ferroelectric layer 228A* during a subsequent anneal process. The tensile stress can improve the formation of O-phase ferroelectric material in ferroelectric layer 228A*. In some embodiments, the nitrogen-rich metal nitride material can be deposited by a PVD process with a process power ranging from about 1 kW to about 3 kW under a pressure from about 30 mtorr to about 75 mtorr. The nitrogen-rich metal nitride material can be deposited with a metal precursor and a nitrogen gas. In some embodiments, the metal precursor can be carried by an argon gas having a flow rate ranging from about 30 sccm to about 500 sccm. In sonic embodiments, the nitrogen gas can have a flow rate ranging from about 150 sccm to about 1000 sccm.

After the deposition of nitrogen-rich metal nitride material, second electrode 232A* can be annealed to improve the formation of O-phase ferroelectric material in ferroelectric layer 228A*, as shown in FIG. 6. In some embodiments, the anneal process can include a rapid thermal anneal (RTA) performed under a temperature ranging from about 400° C. and about 750° C. for a time period of about 5 min to about 30 min. If the temperature is less than about 400° C., O-phase ferroelectric material may not be formed in ferroelectric layer 228A*. If the temperature is greater than about 750° C., the metal nitride material may react with the ferroelectric material in ferroelectric layer 228A* and degrade the device performance of ferroelectric memory 130.

Figure 7:
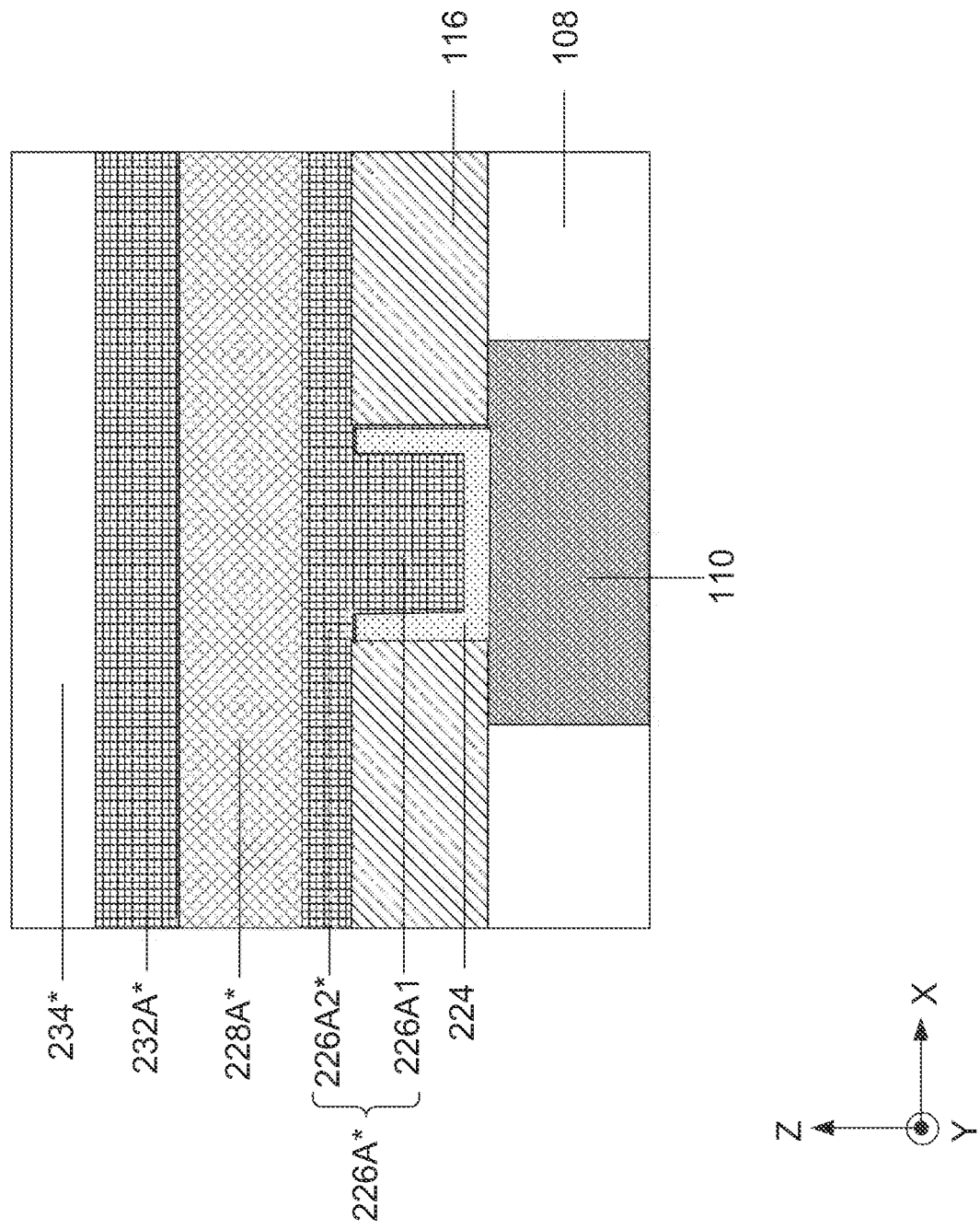

The anneal of second electrode 232A * can be followed by the deposition of cap layer 234 *, as shown in FIG. 7. In some embodiments, cap layer 234 * can be conformally deposited on second electrode 232A * by CVD, ALD, or other suitable deposition methods. In some embodiments, cap layer 234* can include a dielectric material, for example, SiOx, SiNx, SiON, and other suitable dielectric materials. Cap layer 234* can protect second electrode 232A * from damages (e.g., oxidation) during subsequent processes.

Figure 8:
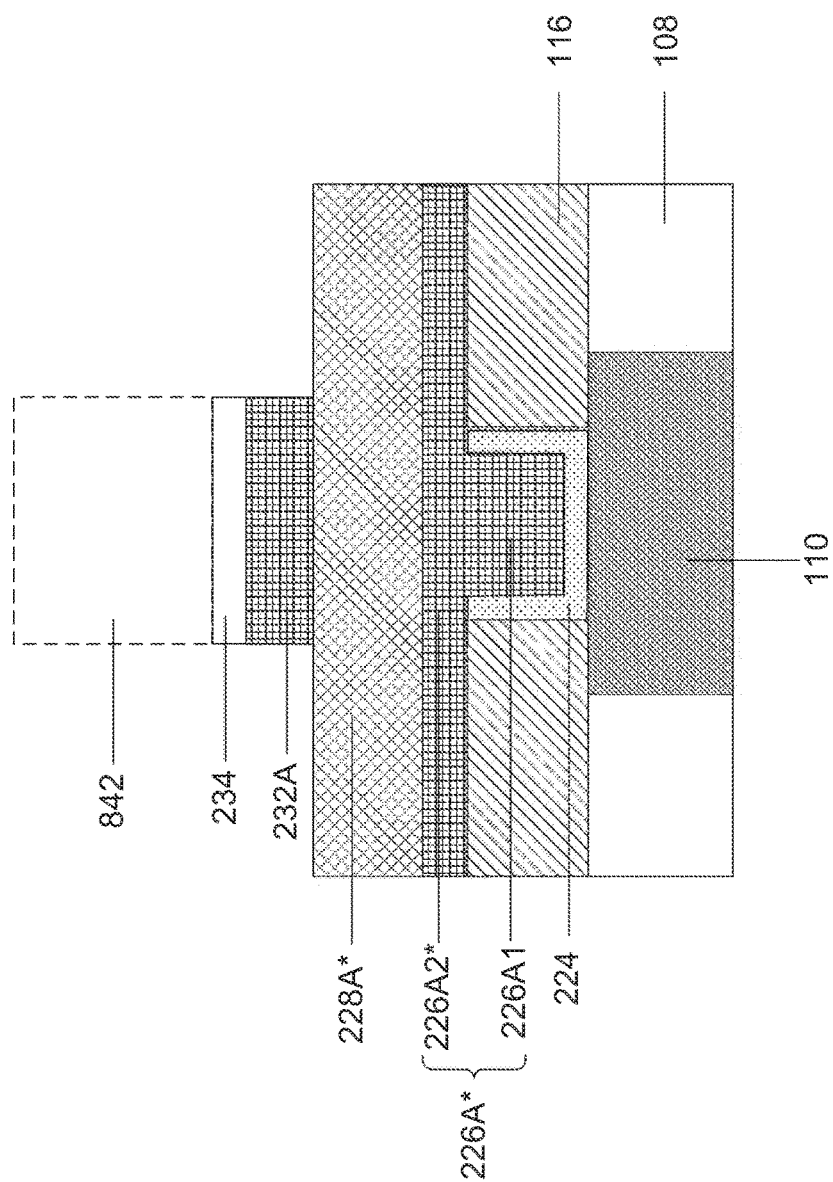

The deposition of cap layer 234* can be followed by the etching of second electrode 232A* and cap layer 234*, as shown in FIG. 8. In some embodiments, a patterning process can form a masking element 842, similar to masking element 442, on cap layer 234*. Masking element 842 can protect regions of cap layer 234* while one or more etching processes sequentially removes exposed regions of cap layer 234* and second electrode 232A*. In some embodiments, the one or more etching processes can be a directional etching process and can include a dry etching process. Ferroelectric layer 228A* can act as the etch stop layer for etching second electrode 232A*. Masking element 842 can be removed after the etching processes.

Figure 9:
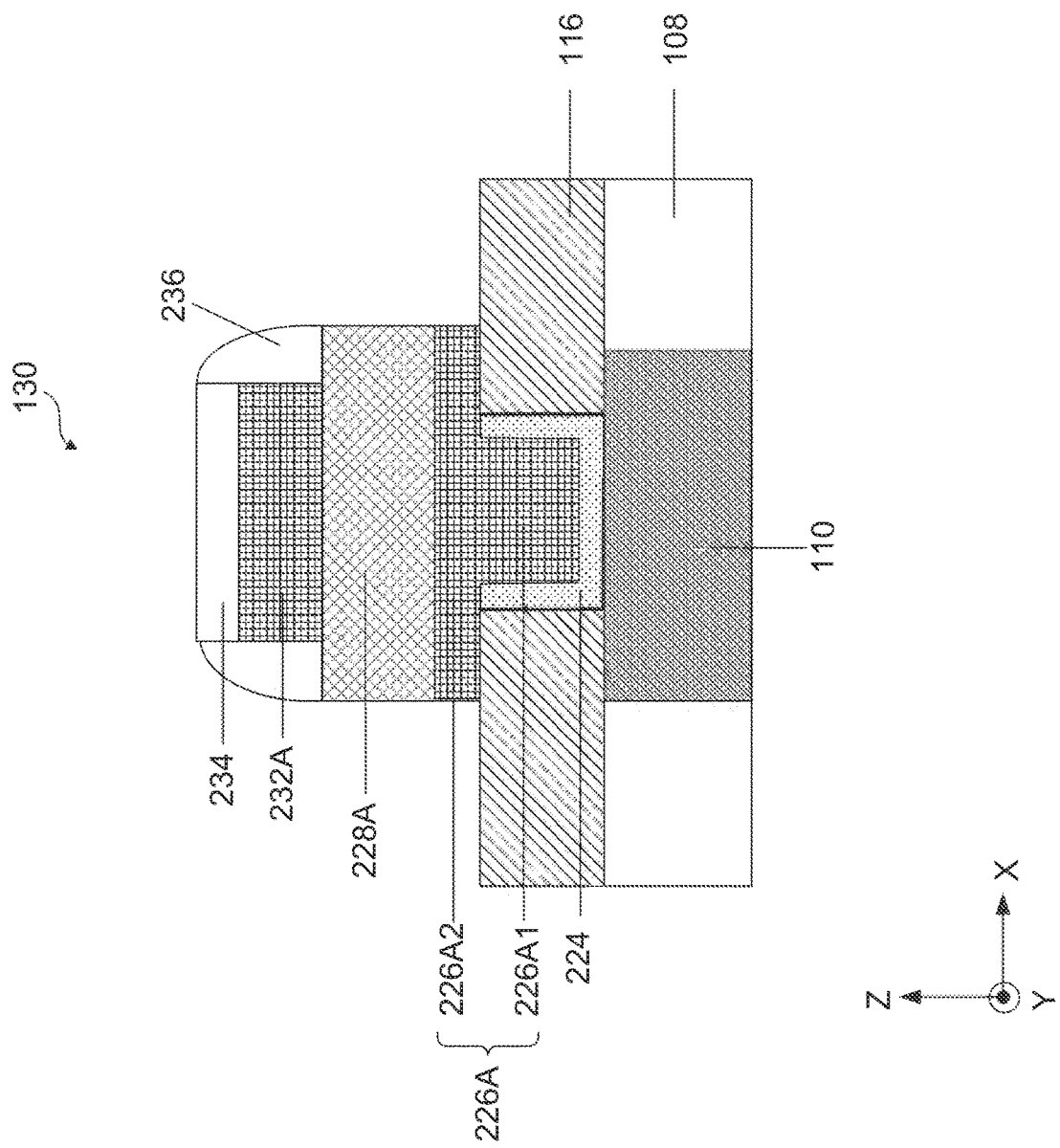

The etching of second electrode 232A* and cap layer 234* can be followed by the etching of ferroelectric layer 228A* and first electrode 226A*. In some embodiments, prior to the etching of ferroelectric layer 228A* and first electrode 226A*, a spacer layer can be conformally deposited on the structure shown in FIG. 8. The spacer layer can prevent short-circuit between first and second electrodes 226A and 232A due to re-deposition of metal nitride materials during subsequent etching processes. Cap layer 234 and second electrode 232A can protect regions of ferroelectric layer 228A* while one or more etching processes sequentially removes exposed regions of ferroelectric layer 228A* and first electrode 226A*. In some embodiments, the one or more etching processes can be a directional etching process and can include a dry etching process. ESL 116 can act as the etch stop layer for etching first electrode 226A*. First ferroelectric memory 130 can be formed after the etching of ferroelectric layer 228A* and first electrode 226A, as shown in FIG. 9.

The formation of first ferroelectric memory 130 can be followed by the conformal deposition of dielectric layer 118, the formation of second ILD structure 122, and the formation of second interconnect structure 120, as shown in FIG. 1. The details of these processes are omitted merely for simplicity and ease of description. First and second interconnect structures 110 and 120 can connect first ferroelectric memory 130 to one or more devices in device layer 106 and other structures on substrate 102.

In some embodiments, as shown in FIGS. 10-14, second ferroelectric memory 140 can be formed without the CMP process after deposition of the metal nitride material for the first electrode. In some embodiments, method 300 can also be applicable to the formation of second ferroelectric memory 140. In some embodiments, the deposition, anneal, and etching processes of forming second ferroelectric memory 140 can be similar to the processes of forming first ferroelectric memory 130.

Figure 10:
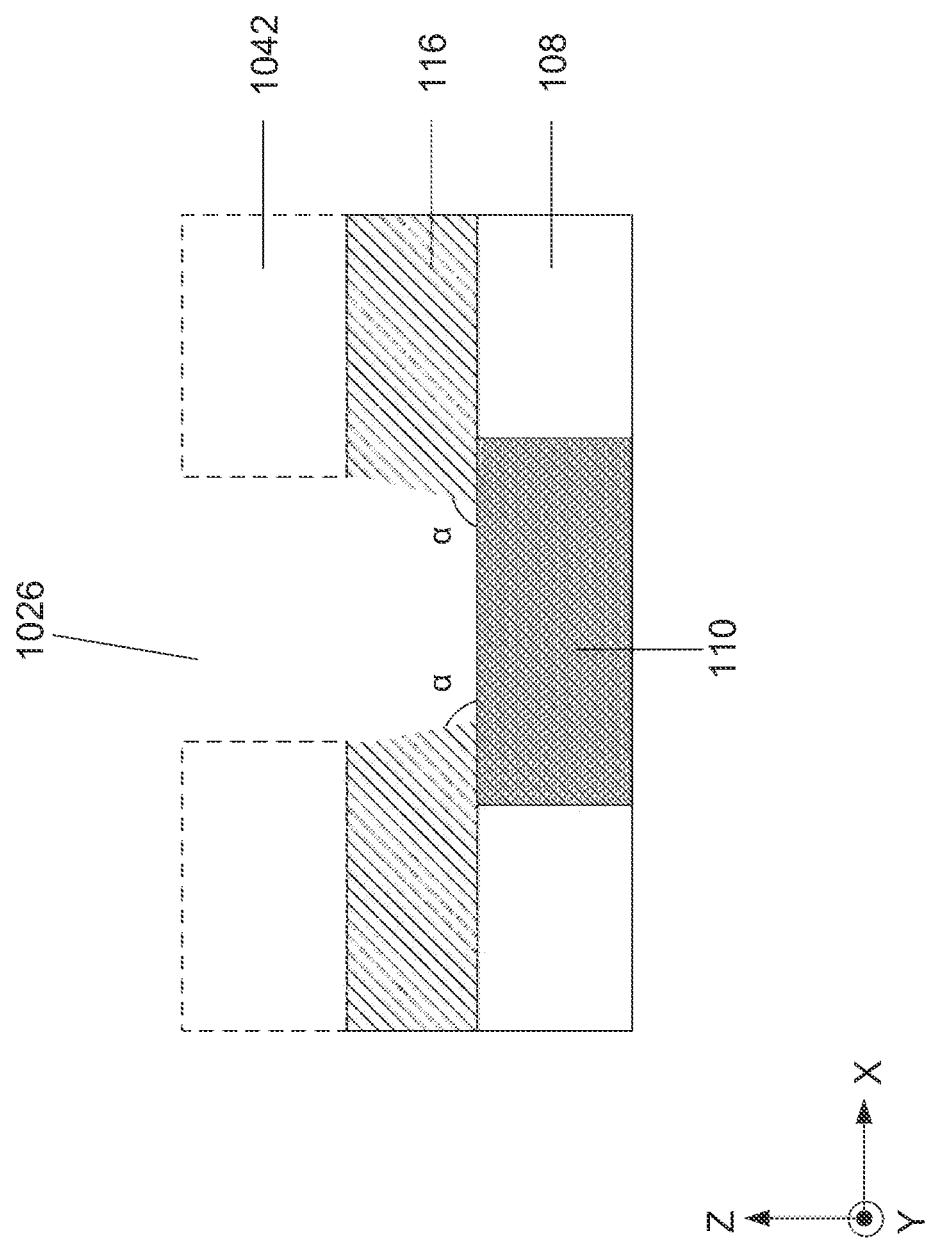
Figure 11:
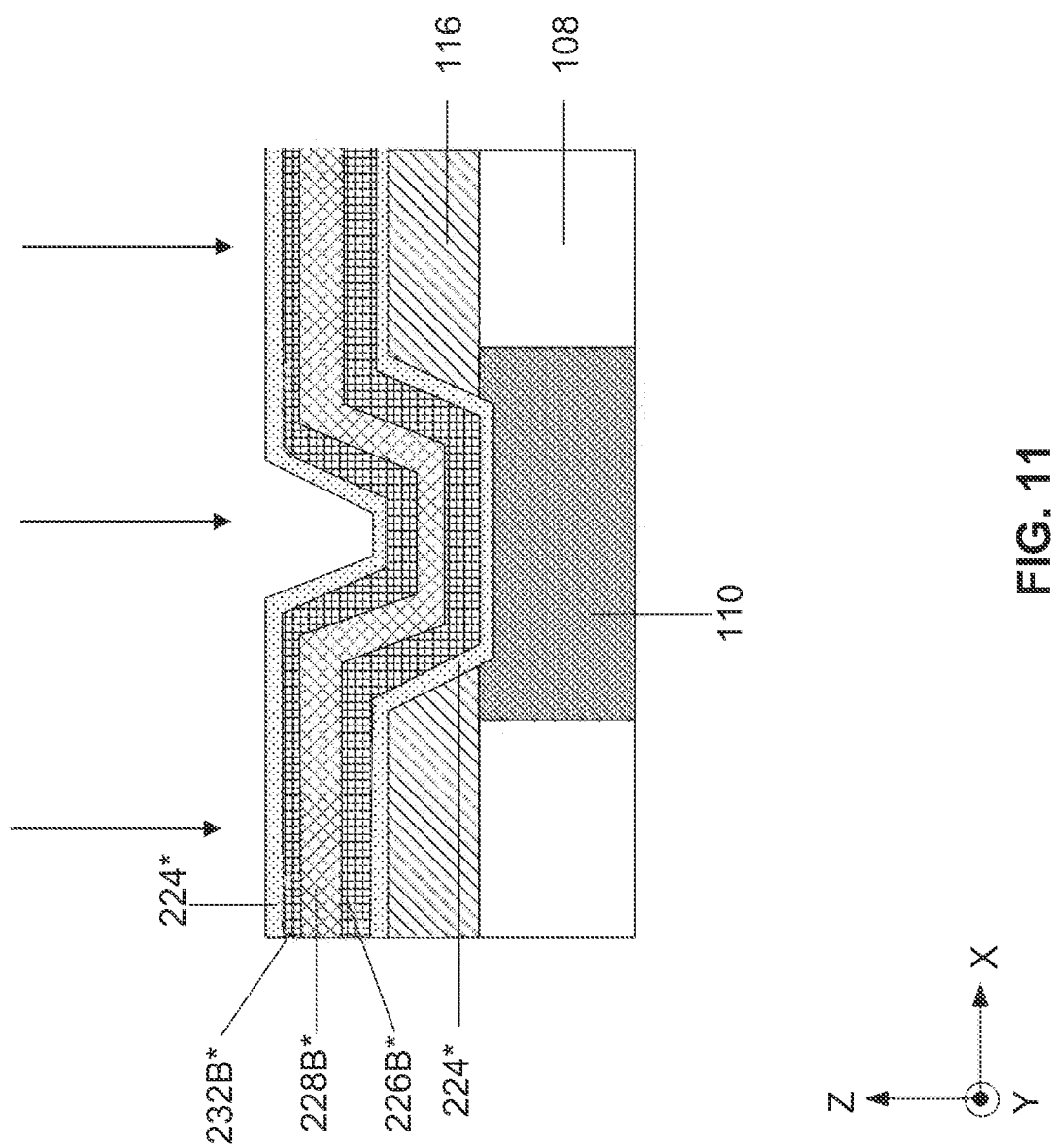

Referring to FIG. 3, in operation 310, first interconnect structure 110 can be formed on substrate 102, as shown in FIGS. 1 and 10. The formation of interconnect structure 110 can be followed by the formation of ESL 116. In operation 320, first electrode 226B* can be formed on interconnect structure 110. In some embodiments, the formation of first electrode 226B* can include forming an opening 1026 in ESL 116 with a masking element 1042 as shown in FIG. 10, conformally depositing barrier layer 224 on interconnect structure 110 and ESL 116 as shown in FIG. 11, and conformally depositing first electrode 226B* on barrier layer 224 as shown in FIG. 11. In some embodiments, as shown in FIG. 10, the bottom of opening 1026 can have an angle a ranging from about 100 degrees to about 150 degrees for deposition of subsequent layers without a CMP process. In operation 330, ferroelectric layer 228B* can be conformally deposited on first electrode 226B* Ferroelectric layer 228B* can include a high-k ferroelectric material the same as or different from ferroelectric layer 228B* in FIG. 6. The O-phase in the high-k ferroelectric material can improve the RAC MW performance of ferroelectric memory 140. In operation 340, second electrode 232B* can be formed on ferroelectric layer 228B*, as shown in FIG. 11. Second electrode 232B* can include the nitrogen-rich metal nitride material. In some embodiments, the nitrogen-to-metal ratio of the nitrogen-rich metal nitride material can range from about 1.04 to about 1.20 to increase the tensile stress between second electrode 232B* and ferroelectric layer 228B* during a subsequent anneal process. The tensile stress can improve the formation of O-phase ferroelectric material in ferroelectric layer 228B *. After the deposition of nitrogen-rich metal nitride material, second electrode 232B* can be annealed with an RTA to improve the formation of O-phase ferroelectric material in ferroelectric layer 228B*, as shown in FIG. 11.

Figure 12:
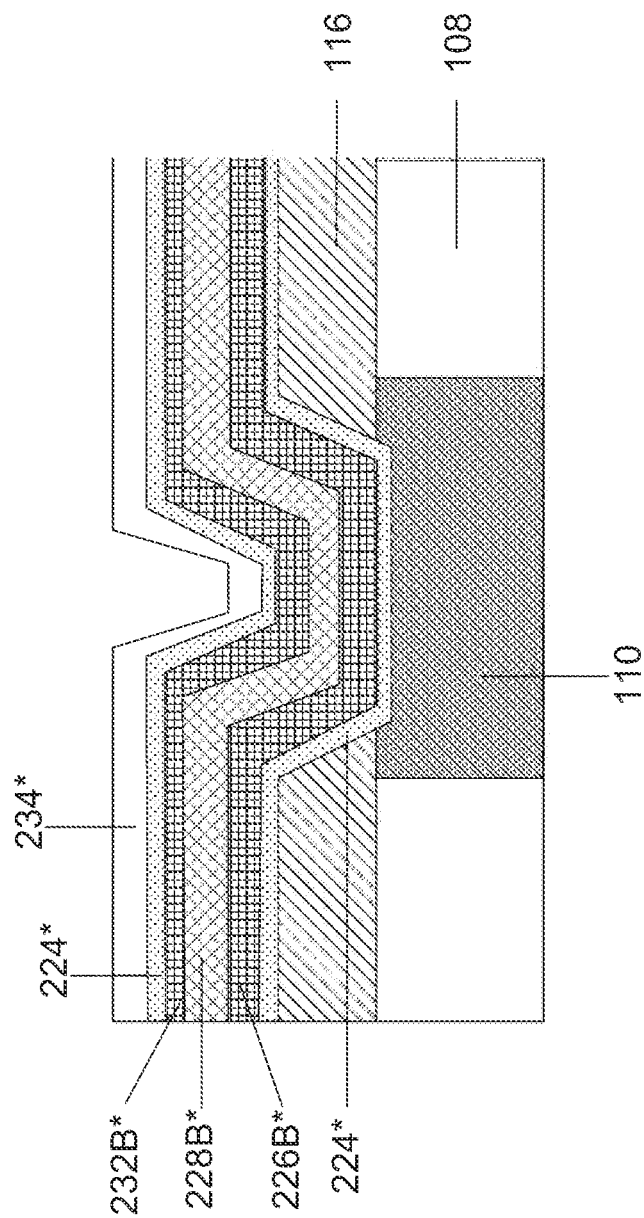
Figure 13:
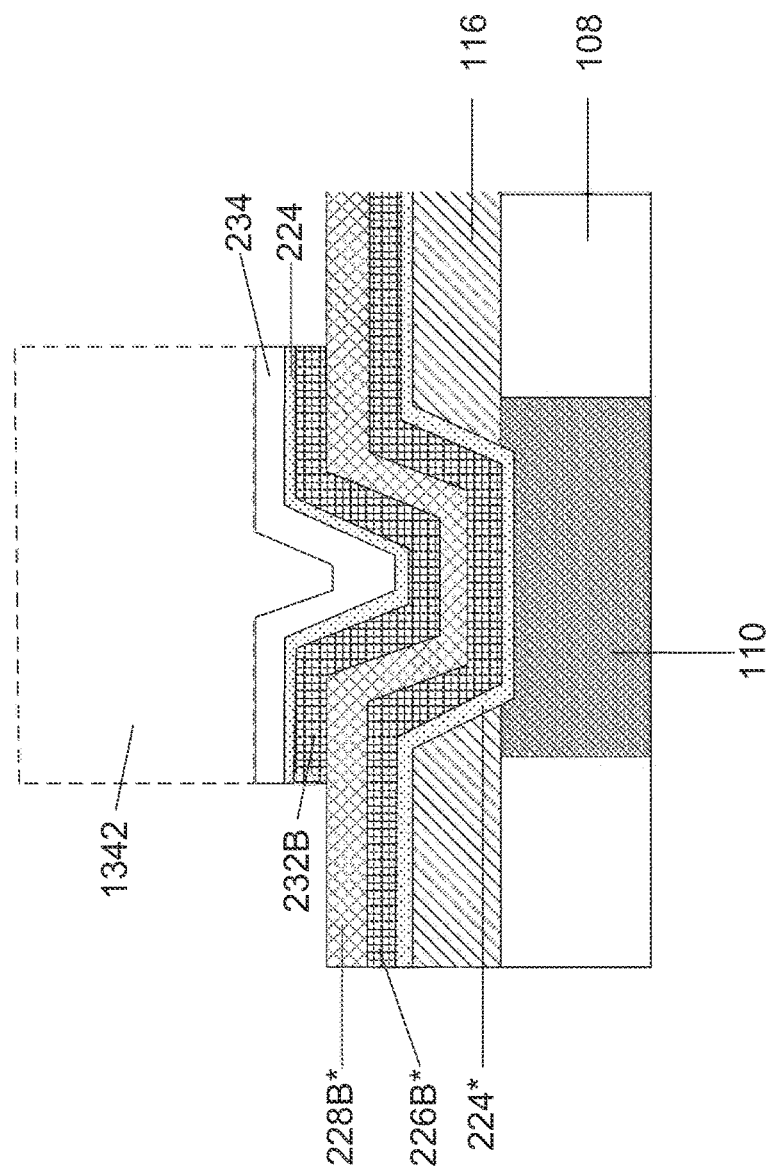
Figure 14:
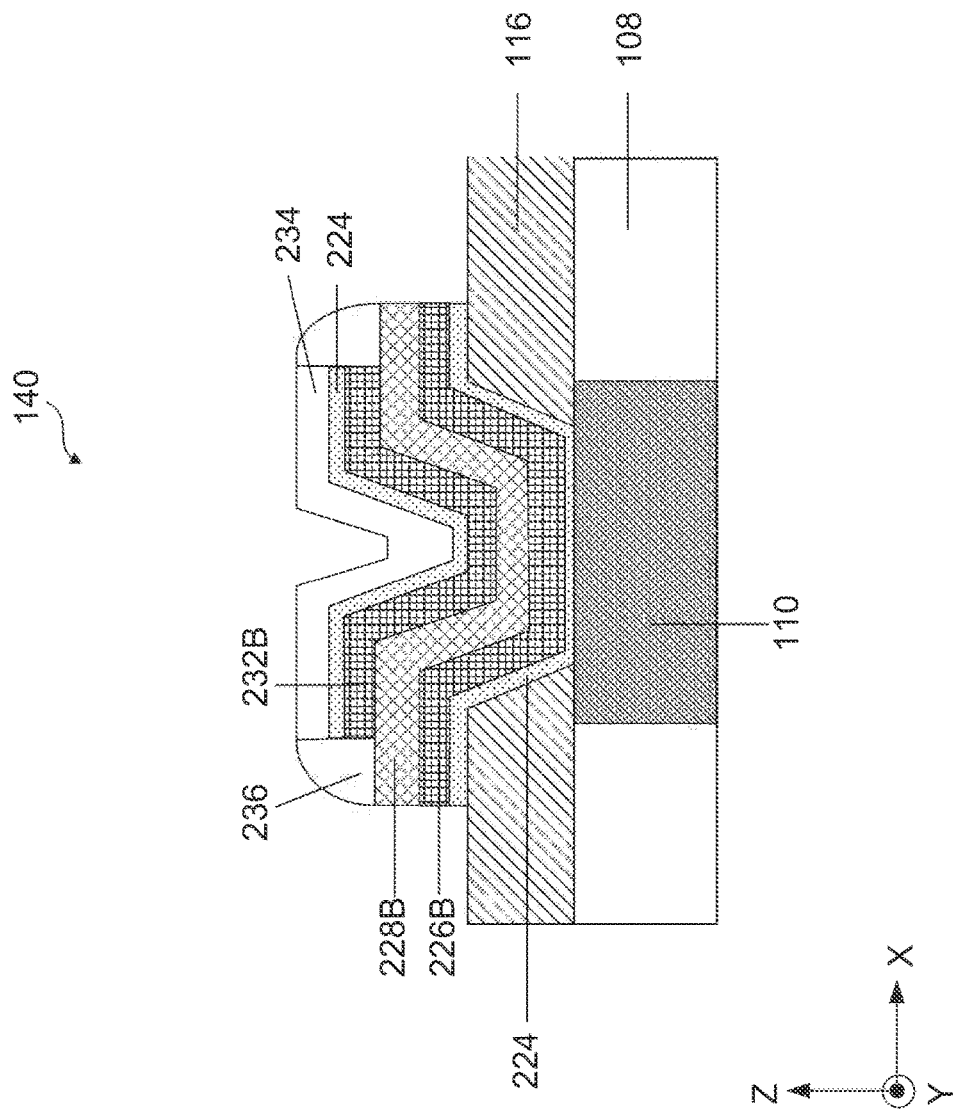

The anneal of second electrode 232B* can be followed by conformally depositing barrier layer 224* on second electrode 232B* as shown in FIG. 11 and conformally depositing cap layer 234* on barrier layer 224* as shown in FIG. 12. The deposition of barrier layer 224* and cap layer 234* can be followed by etching cap layer 234*, barrier layer 224*, and second electrode 2329* with a masking element 1342 as shown in FIG. 13. The etching of cap layer 234*, barrier layer 224*, and second electrode 232B* can be followed by depositing a spacer layer on the structure of FIG. 13. The deposition of the spacer layer can be followed by etching the spacer layer to form spacers 236, and etching ferroelectric layer 228B and first electrode 226B to form ferroelectric memory 140 as shown in FIG. 14.

The formation of second ferroelectric memory 140 can be followed by the conformal deposition of dielectric layer 118, the formation of second ILD structure 122, and the formation of second interconnect structure 120, as shown in FIG. 1. The details of these processes are omitted merely for simplicity and ease of description. First and second interconnect structures 110 and 120 can connect second ferroelectric memory 140 to one or more devices in device layer 106 and other structures on substrate 102.

Figure 15:
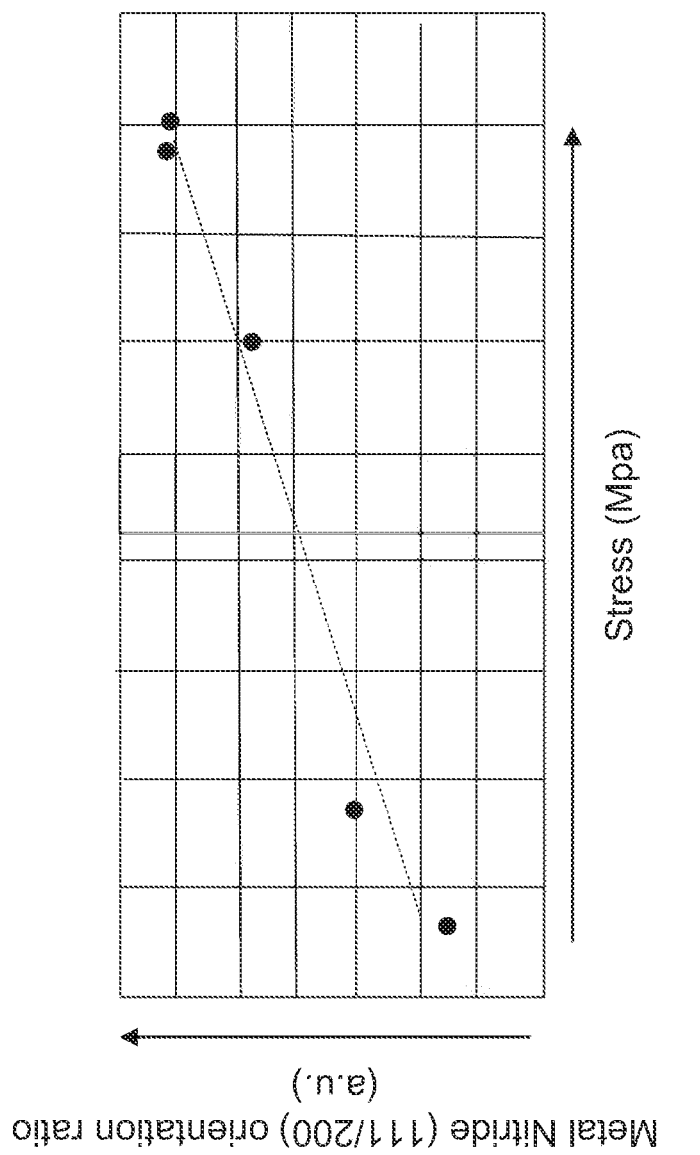
FIGS. 15-20 illustrate various improved performance of semiconductor devices having a ferroelectric memory, in accordance with some embodiments.
Figure 16:
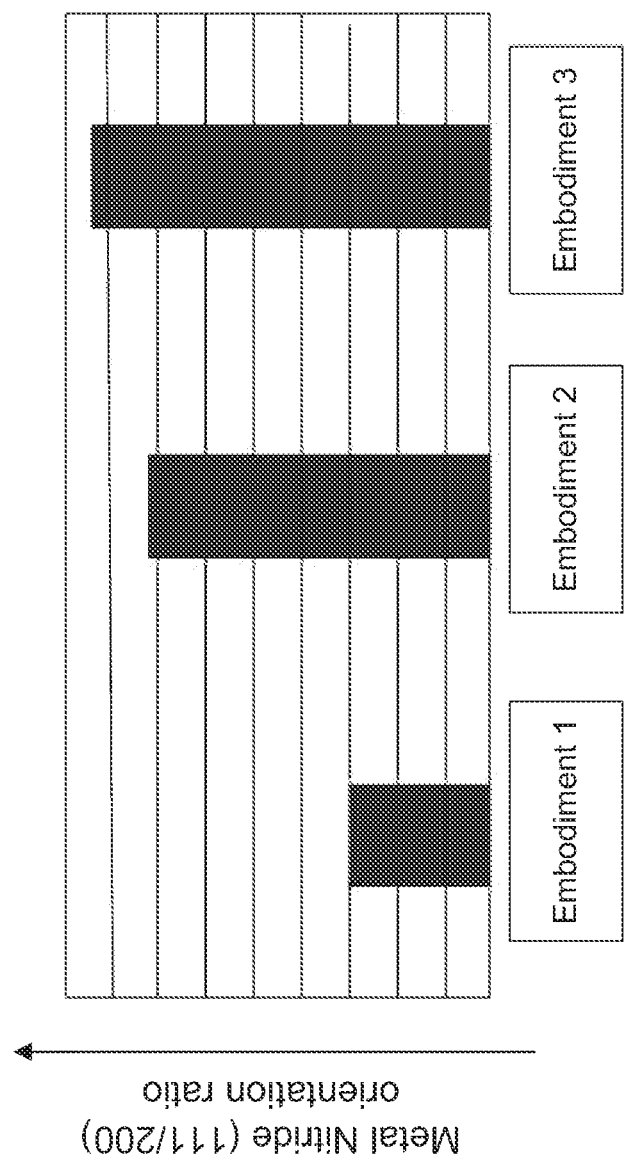
Figure 17:
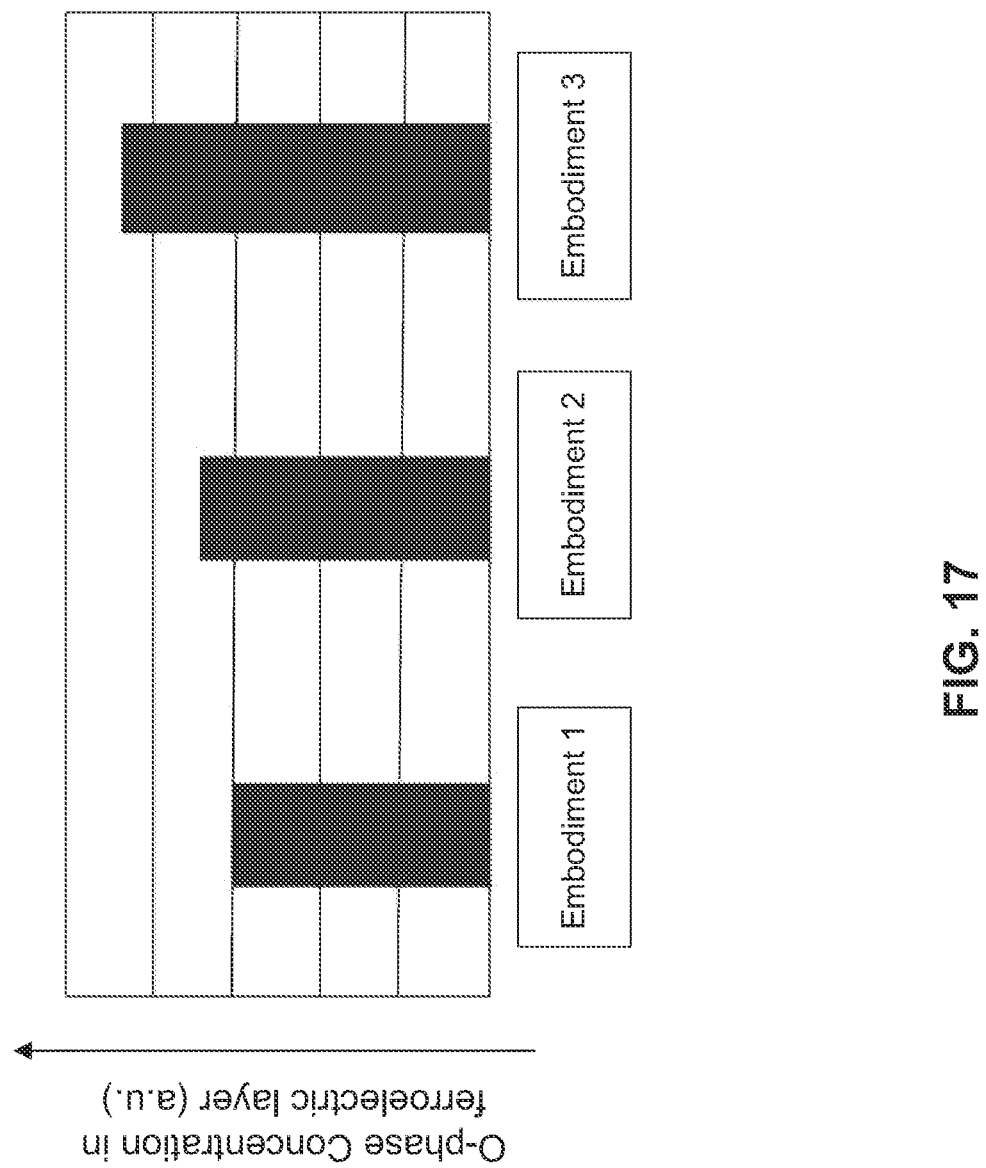
Figure 18:
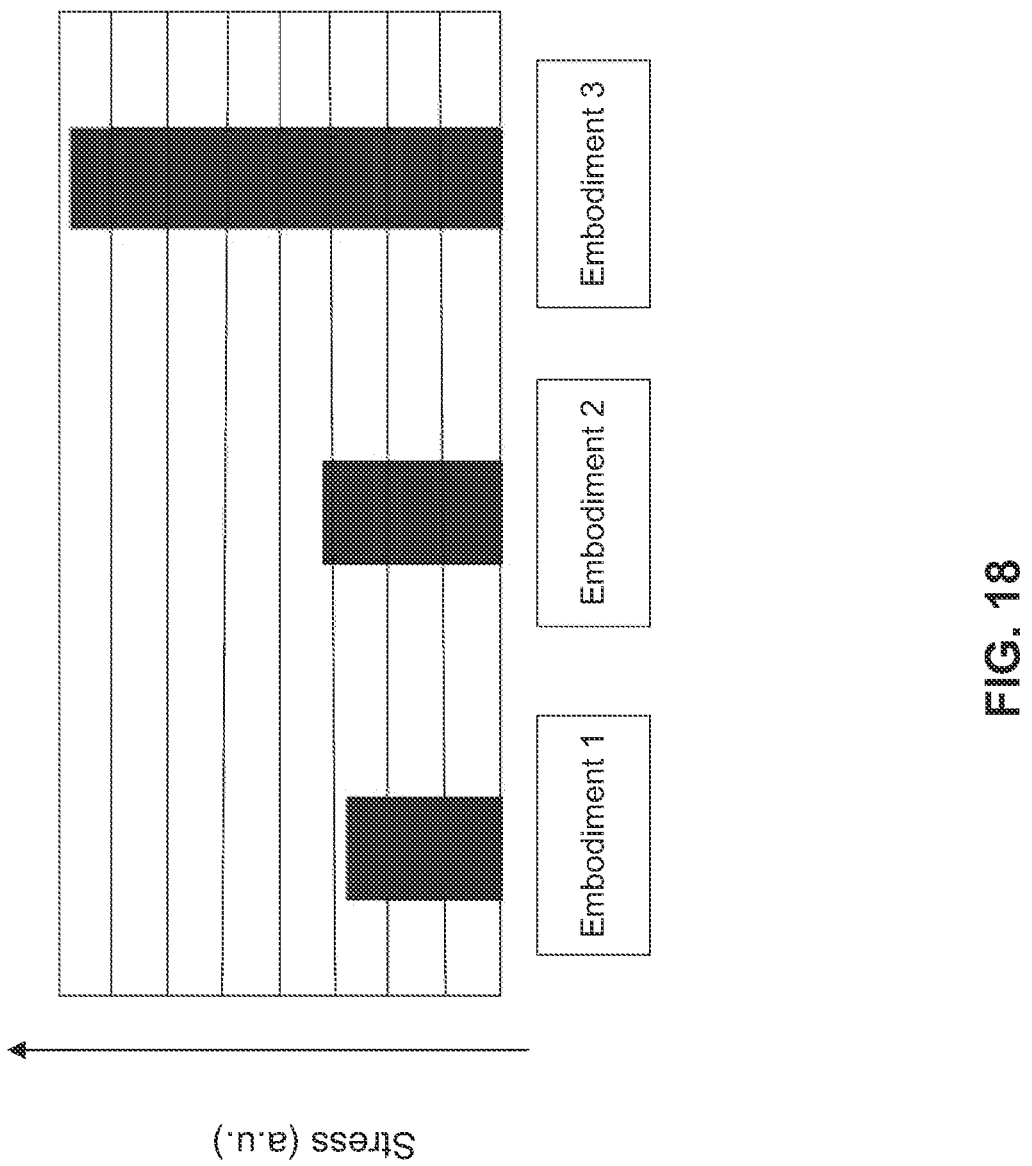
Figure 19:
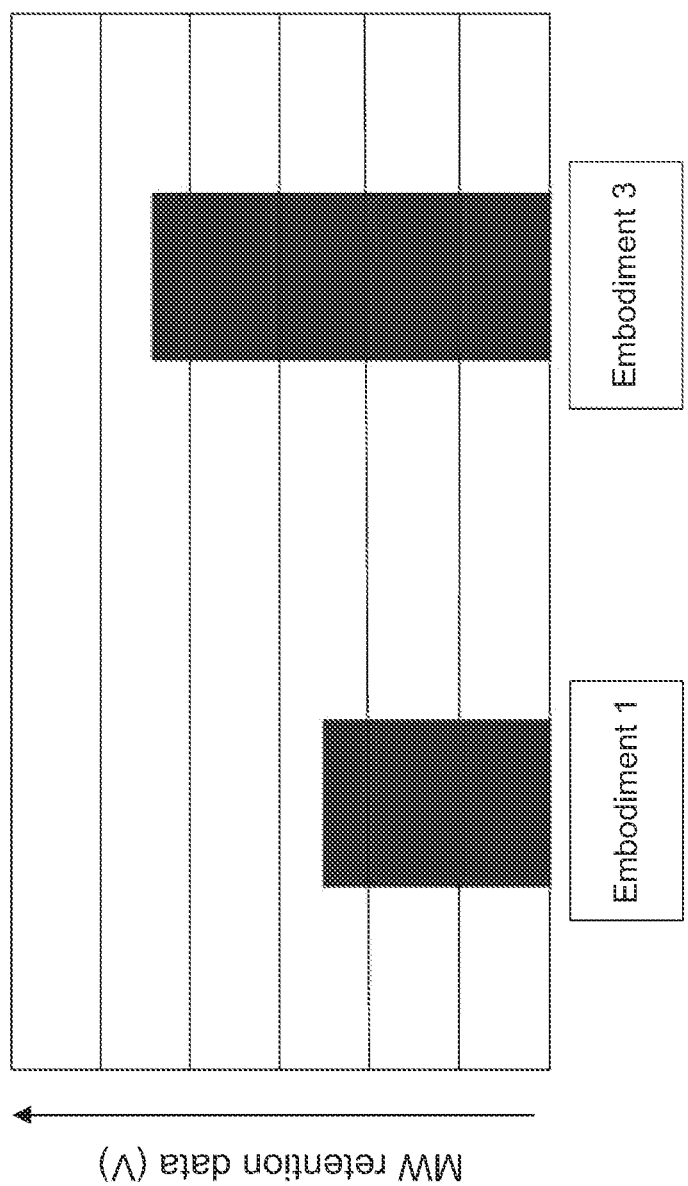

FIGS. 15-20 illustrate various improved performance of semiconductor devices having a ferroelectric memory, in accordance with some embodiments. As shown in FIG. 15, the stress between second electrode 232 and ferroelectric layer 228 increases with the increase of the ratio of the (111) crystal orientation to the (200) crystal orientation in the metal nitride materials. Referring to FIGS. 16-20, first electrode 226 of embodiment 1 can have a metal nitride material with a first concentration of the (111) crystal orientation, first electrode 226 of embodiment 2 can have the metal nitride material with a second concentration of the (111) crystal orientation, and first electrode 226 of embodiment 3 can have the metal nitride material with a third concentration of the (111) crystal orientation. In some embodiments, the first concentration can be less than the second concentration, and the second concentration can be less than the third concentration. As shown in FIG. 16, the ratio of the (111) crystal orientation to the (200) crystal orientation in the metal nitride materials increases with the concentration of the (111) crystal orientation in embodiments 1-3. As shown in FIG. 17, the concentration of O-phase ferroelectric material in the ferroelectric layer increases with the concentration of the (111) crystal orientation in embodiments 1-3. As shown in FIG. 18, the stress between second electrode 232 and ferroelectric layer 228 increases with the concentration of the (111) crystal orientation in embodiments 1-3. As shown in FIG. 19, embodiment 3 with a higher concentration of the (111) crystal orientation than embodiment 1 can have a higher MW retention after a thermal treatment, for example, a baking at a temperature about 125° C. for about 30 min.

Figure 20:
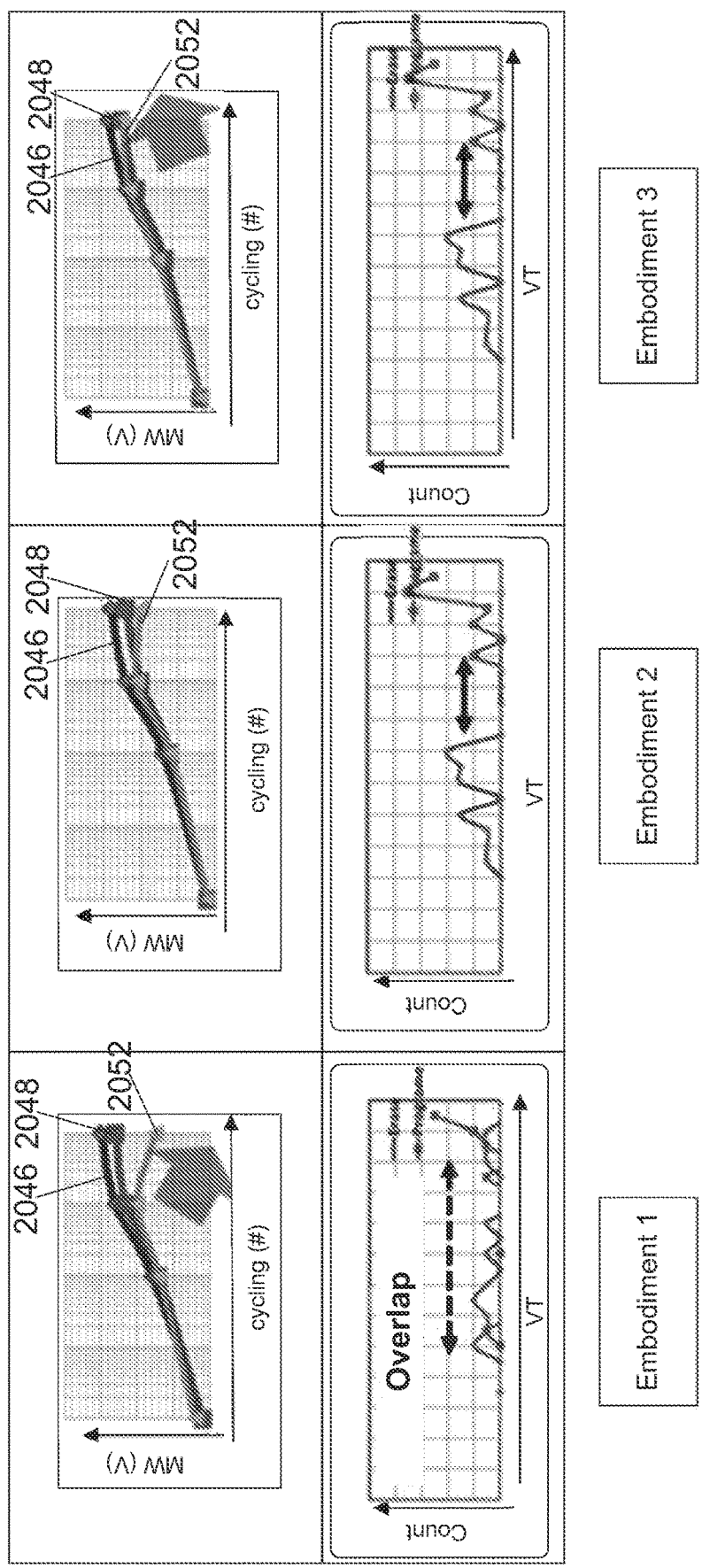

Referring to FIG. 20, profile 2046 can illustrate a large cell size (e.g., about 800 $\mu m^2$) for embodiments 1-3, profile 2048 can illustrate a medium cell size (e.g., about 250 $\mu m^2$) for embodiments 1-3, and profile 2052 can illustrate a small cell size (e.g., about 100 $\mu m^2$) for embodiments 1-3. As shown in FIG. 20, for embodiment 1 with a lower concentration of the (111) crystal orientation, the MW of the small cell size can degrade with the increase of the number of read/write cycles, for example, after about 1000 cycles. The threshold voltages for the ferroelectric memory devices have significantly overlap under erase and program conditions, which can indicate device performance non-uniformity of the ferroelectric memory devices. As shown in FIG. 20, embodiments 2 and 3 with higher concentrations of the (111) crystal orientation can have improved MW performance of the ferroelectric memory devices, especially for the small cell size represented by profile 2052. Additionally, the standard deviations of the threshold voltages for the ferroelectric memory devices decrease for embodiments 2 and 3 under erase and program conditions, which can indicate improved uniformity of device performance for the ferroelectric memory devices and improved uniformity of O-phase ferroelectric material in the ferroelectric layer of the ferroelectric memory devices.

Various embodiments of the present disclosure provide example semiconductor device 100 having ferroelectric memories 130 and 140 with enhanced RAC MW performance. In some embodiments, semiconductor device 100 can include nitrogen-rich first and second electrodes 226 and 232 and ferroelectric layer 228 between first and second electrodes 226 and 232. In some embodiments, nitrogen-rich first and second electrodes 226 and 232 can improve the formation of the orthorhombic phase (O-phase) ferroelectric material in ferroelectric layer 228. In some embodiments, nitrogen-rich second electrode 232 can increase the tensile stress between second electrode 232 and ferroelectric layer 228. An anneal process after deposition of nitrogen-rich second electrode 232 can improve the formation of O-phase ferroelectric material in ferroelectric layer 228. In some embodiments, nitrogen-rich first and second electrodes 226 and 232 can include a metal nitride material with a nitrogen-to-metal ratio ranging from about 1.04 to about 1.20 to increase the (111) crystal orientation in the metal nitride material. In some embodiments, the ratio of the (111) crystal orientation to the (200) crystal orientation can range from about 1.6 to about 2.0 to enhance the formation, uniformity, and stabilization of the O-phase ferroelectric material in ferroelectric layer 228.

In some embodiments, a semiconductor device includes an interconnect structure on a substrate, a first electrode on the interconnect structure, a ferroelectric, layer on the first electrode, and a second electrode on the ferroelectric layer. The first electrode includes a metal nitride conductive material having a nitrogen concentration greater than a metal concentration. The ferroelectric layer includes a ferroelectric material. The second electrode includes the metal nitride conductive material.

In some embodiments, a semiconductor device includes a transistor on a substrate, an interconnect structure electrically connected to the transistor; and a ferroelectric memory electrically connected to the interconnect structure. The ferroelectric memory includes first and second electrodes having a metal nitride conductive material and a ferroelectric layer between the first and second electrode. The metal nitride conductive material has a nitrogen concentration greater than a metal concentration.

In some embodiments, a method includes, forming an interconnect structure on a substrate, forming a first electrode on the interconnect structure, forming a ferroelectric layer on the first electrode, and forming a second electrode on the ferroelectric layer. The first electrode includes a metal nitride conductive material having a nitrogen concentration greater than a metal concentration. The ferroelectric layer includes a ferroelectric material. The second electrode includes the metal nitride conductive material.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an interconnect structure on a substrate;
a first electrode on the interconnect structure, wherein the first electrode comprises a first portion and a second portion on the first portion, wherein the first portion comprises a first metal nitride conductive material, wherein the second portion comprises a second metal nitride conductive material, and wherein a first nitrogen-to-metal ratio of the first metal nitride conductive material and a second nitrogen-to-metal ratio of the second metal nitride conductive material are different;
a ferroelectric layer on the first electrode, wherein the ferroelectric layer comprises a ferroelectric material having an orthorhombic phase, and
a second electrode on the ferroelectric layer, wherein the second electrode comprises the second metal nitride conductive material.

2. The semiconductor device of claim 1, wherein a nitrogen-to-metal ratio of the second metal nitride conductive material ranges from about 1.04 to about 1.2.

3. The semiconductor device of claim 1, wherein the second metal nitride conductive material comprises at least one of titanium nitride, tantalum nitride, hafnium nitride, zirconium nitride, vanadium nitride, and scandium nitride.

4. The semiconductor device of claim 1, wherein the second metal nitride conductive material comprises a (111) crystal orientation and a (200) crystal orientation, and
wherein a ratio of a first intensity of the (111) crystal orientation to a second intensity of the (200) crystal orientation ranges from about 1.6 to about 2.0.

5. The semiconductor device of claim 1, wherein the first portion has a first width and is on the interconnect structure and the second portion has a second width and is between the first portion and the ferroelectric layer, and wherein the second width is greater than the first width.

6. The semiconductor device of claim 1, wherein the ferroelectric layer comprises at least one of hafnium zirconium oxide, hafnium aluminum oxide, hafnium lanthanum oxide, hafnium cerium oxide, hafnium oxide, hafnium silicon oxide, and hafnium gadolinium oxide.

7. The semiconductor device of claim 1, further comprising a barrier layer between the interconnect structure and the first electrode.

8. The semiconductor device of claim 1, further comprising a cap layer on the second electrode.

9. The semiconductor device of claim 1, further comprising an additional interconnect structure electrically connected to the second electrode.

10. A semiconductor device, comprising:
a transistor on a substrate;
an interconnect structure electrically connected to the transistor; and
a ferroelectric memory electrically connected to the interconnect structure, wherein the ferroelectric memory comprises:
first and second electrodes comprising a nitrogen-rich metal nitride conductive material having a nitrogen concentration greater than a metal concentration; and
a ferroelectric layer between the first and second electrodes.

11. The semiconductor device of claim 10, wherein a nitrogen-to-metal ratio of the metal nitride conductive material ranges from about 1.04 to about 1.2.

12. The semiconductor device of claim 1, wherein the metal nitride conductive material comprises a (111) crystal orientation and a (200) crystal orientation, and wherein a ratio of a first intensity of the (111) crystal orientation to a second intensity of the (200) crystal orientation ranges from about 1.6 to about 2.0.

13. The semiconductor device of claim 10, wherein the ferroelectric layer comprises at least one of hafnium zirconium oxide, hafnium aluminum oxide, hafnium lanthanum oxide, hafnium cerium oxide, hafnium oxide, hafnium silicon oxide, and hafnium gadolinium oxide.

14. A semiconductor device, comprising:
a first interconnect structure on a substrate;
a ferroelectric memory on the first interconnect structure, wherein the ferroelectric memory comprises:
first and second electrodes comprising a metal nitride conductive material having a nitrogen concentration greater than a metal concentration in the metal nitride conductive material, wherein the metal nitride conductive material comprises a (111) crystal orientation and a (200) crystal orientation having a lower intensity than that of the (111) crystal orientation; and
a ferroelectric layer between the first and second electrodes; and
a second interconnect structure on the ferroelectric memory and in contact with the second electrode.

15. The semiconductor device of claim 14, wherein a nitrogen-to-metal ratio of the metal nitride conductive material ranges from about 1.04 to about 1.2.

16. The semiconductor device of claim 14, wherein the metal nitride conductive material comprises a (111) crystal orientation and a (200) crystal orientation, and
wherein a ratio of a first intensity of the (111) crystal orientation to a second intensity of the (200) crystal orientation ranges from about 1.6 to about 2.0.

17. The semiconductor device of claim 14, further comprising a barrier layer between the first interconnect structure and the first electrode.

18. The semiconductor device of claim 1, wherein the second nitrogen-to-metal ratio is greater than the first nitrogen-to-metal ratio.

19. The semiconductor device of claim 10, wherein the first electrode comprises a first portion and a second portion between the first portion and the ferroelectric layer, and wherein a first nitrogen-to-metal ratio of the first portion is less than a second nitrogen-to-metal ratio of the second portion.

20. The semiconductor device of claim 14, wherein the first electrode comprises a first portion and a second portion between the first portion and the ferroelectric layer, and wherein a first resistance of the first portion is greater than a second resistance of the second portion.

* * * * *